United States Patent [19]

Sakaguchi et al.

[11] Patent Number: 5,277,748

[45] Date of Patent: Jan. 11, 1994

[54] SEMICONDUCTOR DEVICE SUBSTRATE AND PROCESS FOR PREPARING THE SAME

[75] Inventors: Kiyofumi Sakaguchi; Takao Yonehara, both of Atsugi, Japan

[73] Assignee: Canon Kabushiki Kaisha, Tokyo, Japan

[21] Appl. No.: 10,566

[22] Filed: Jan. 28, 1993

[30] Foreign Application Priority Data

Jan. 31, 1992 [JP] Japan ................... 4-046306

[51] Int. Cl.$^5$ .......................... H01L 21/306
[52] U.S. Cl. .................... 156/630; 437/62; 437/71; 437/974; 148/DIG. 12; 148/DIG. 135
[58] Field of Search ............ 156/630; 437/62, 71, 437/974; 148/DIG. 12, DIG. 135, 33.3

[56] References Cited

U.S. PATENT DOCUMENTS

| 4,393,577 | 7/1983 | Imai ......................... 437/62 |
| 4,532,700 | 8/1985 | Kinney et al. ................ 437/71 |
| 4,628,591 | 12/1986 | Zorinsky et al. .............. 437/71 |
| 4,910,165 | 3/1990 | Lee et al. ................... 437/62 |
| 5,013,681 | 5/1991 | Godbey et al. ................ 437/86 |
| 5,094,697 | 3/1992 | Takabayashi et al. .......... 136/249 |

FOREIGN PATENT DOCUMENTS

| 0020678 | 2/1979 | Japan .................... 437/62 |
| 0058852 | 3/1988 | Japan .................... 437/62 |
| 0230755 | 9/1990 | Japan .................... 437/62 |
| 0070156 | 3/1991 | Japan .................... 437/62 |
| 0148526 | 5/1992 | Japan ................ 148/DIG. 12 |

OTHER PUBLICATIONS

"A New Dielectric Isolation Method using Porous Silicon" by K. Imai; Solid-State Electronics; vol. 24, 1981; pp. 159-164.
"Formation Mechanism of Porous Silicon Layer by Anodization in HF Solution" by T. Unagami; Journal of the Electrochemical Society; vol. 127 No. 2; Feb. 1980; pp. 476-483.
"Complete dielectric isolation by highly selective and self-stopping formation of oxidized porous silicon" by R. P. Holmstrom et al.; Applied Physics Letters; Feb. 15, 1983, vol. 42; No. 4; pp. 386-388.
"Electrolytic Shaping of Germanium and Silicon" by A. Uhlir, Jr.; Technical Journal; vol. XXXV; 1956; pp. 332-346.
"Pore Size Distribution in Porous Silicon Studied by Adsorption Isotherms" by G. Bomchil et al.; Journal of the Electrochemical Society; vol. 130, No. 7, Jul. 1983; pp. 1612-1614.
"Singly-Crystal silicon on Non-single-Crystal Insulators" by G. W. Cullen; Journal of Crystal Growth; vol. 63, No. 3; Oct. 11, 1983; pp. 429-590 and introduction.

Primary Examiner—Brian E. Hearn
Assistant Examiner—Trung Dang
Attorney, Agent, or Firm—Fitzpatrick, Cella, Harper & Scinto

[57] ABSTRACT

A process for preparing a semiconductor device substrate comprises a step of making at least one surface of a first substrate composed of Si material porous, a step of oxidizing inside walls of pores in the resulting porous Si surface layer, a step of forming a monocrystalline Si layer on the porous Si surface layer, a step of bonding the monocrystalline Si layer to one surface of a second substrate through an insulating layer therebetween, a first etching step of removing the first substrate by selective etching except for the porous Si layer, and a second etching step of impregnating the porous Si layer exposed by the removal of the first substrate with hydrofluoric acid or a first liquid mixture of hydrofluoric acid and at least one of an alcohol and a hydrogen peroxide solution, or by buffered hydrofluoric acid or a second liquid mixture of bufffered hydrofluoric acid and at least one of an alcohol and an hydrogen peroxide solution, thereby selectively removing the porous Si layer.

23 Claims, 17 Drawing Sheets

SEMICONDUCTOR DEVICE SUBSTRATE AND PROCESS FOR PREPARING THE SAME

BACKGROUND OF THE INVENTION

1. Field of the Invention

The present invention relates to a semiconductor device substrate and a process for preparing the same, and more particularly to a semiconductor device substrate suitable for an electronic device dielectrically isolated or formed on a monocrystalline semiconductor layer on an insulator and an integrated circuit, and a process for preparing the same.

2. Related Background Art

Formation of a monocrystalline Si semiconductor layer on an insulator is widely known as a silicon-on-insulator (SOI) technique and has been extensively studied because devices based on utilization of the SOI technique have many advantages that have not be obtained in case of bulk Si substrates for preparing ordinary Si integrated circuits. That is, the following advantages can be obtained by utilizing the SOI technique:

1. Easy dielectric isolation with a possibility of higher level integration,
2. Distinguished resistance to radiation,
3. Reduced floating capacity with a possibility of higher speed,
4. Omission of well formation step
5. Prevention of latch-up,
6. Possibility to form a fully depleted, field effect transistor by thin film formation, etc.

To obtain the above-mentioned many advantages of device characteristics, processes for forming the SOI structure have been studied for several ten years. The results are summarized for example, in the following literature: Special Issue: "Single-crystal silicon on non-single-crystal insulators", edited by G. W. Cullen, Journal of Crystal Growth, Volume 63, No. 3, pp 429–590 (1983).

In the past, SOS (silicon-on-sapphire) formed by heteroepitaxial growth of Si on a monocrystalline sapphire substrate by CVD (chemical vapor deposition) was disclosed as a successful result of most matured SOI technique, but its wide application was interrupted by the occurrence of many crystal defects due to lattice mismatching at the interface between the Si layer and the underlayer sapphire substrate, by diffusion of aluminum into the Si layer from the sapphire substrate, and largely by a high cost of the substrate and delay in formation of larger area.

Recently, some attempts have been made to form an SOI structure without using the sapphire substrate. The attempts can be classified into the following two major groups.

1. After the surface oxidation of a Si monocrystalline substrate, windows are made to partially expose the Si substrate, and a Si monocrystalline layer is formed on the $SiO_2$ by epitaxial growth of Si in the lateral direction, while utilizing the exposed portion of the Si substrate as seeds. (In this case, deposition of the Si layer on the $SiO_2$ is made.)
2. A Si monocrystalline substrate itself is utilized as an active layer and $SiO_2$ is formed as its underlayer. (In this case, no Si layer is deposited.)

The following means are known to realize the above group 1: a process for direct epitaxial growth of a monocrystalline Si layer in the lateral direction by CVD; a process for deposition of amorphous Si and successive epitaxial growth in the lateral direction in the solid phase by heat treatment; a process for irradiation of an amorphous or polycrystalline Si layer with a converged energy beam such as an electron ray, a laser beam, etc. to made a monocrystalline layer grow on $SiO_2$ through melting and recrystallization; and a process for scanning a melt zone by a rod heater bandwise (Zone Melting Recrystallization). These processes have advantages and disadvantages together, and still have problems in the controllability productivity, uniformity and quality, and thus have not be commercially used. For example, the CVD process requires sacrificial oxidation to form a flat thin film, whereas the solid phase growth process suffers from poor crystallinity. The beam anneal has problems in the treating time by the converged beam, the state of overlapped beams, focus adjustment, etc. Among them, the zone melting recrystallization process in a most matured process, by which relative large integrated circuits have been made on trail, but there remain still many crystal defects such as quasigrain boundaries, etc. and thus minority carrier devices have not yet been made.

The process without using the Si substrate as a seed for epitaxial growth as the above-mentioned group 2 includes the following 4 procedures.

1. An oxide film is formed on the surface of a Si monocrystalline substrate, the surface having anisotropically etched V-shaped grooves; a polycrystalline Si layer is deposited on the oxide film to the same thickness as that of the Si substrate; and then the back side of the Si substrate is polished to form dielectrically isolated Si monocrystalline regions, which are surrounded by the V-shaped grooves on the thick polycrystalline Si layer. This procedure gives a good crystallinity, but still has problems of controllability and productivity in the step of depositing the polycrystalline Si layer to a thickness of several hundred microns and the step of polishing the back side of the monocrystalline Si substrate to leave only dielectrically separated Si active layer.

2. A $SiO_2$ layer in formed by implanting oxygen ions into a Si monocrystalline substrate called "SIMOX (separation by ion-implanted oxygen)". This procedure is now the most matured one because of a good matching with Si process. However, in order to form the $SiO_2$ layer, oxygen ions must be implanted at least at $10^{18}$ ions/cm$^2$, and the implantation time is very long and the productivity is not so high. The wafer cost is also high. Furthermore, there remain many crystal defects. That is, no commercially satisfactory quality for making minority carrier devices can be obtained.

3. Procedure for making an SOI structure by dielectric isolation on the basis of oxidation of porous Si. The procedure comprises forming an n-type Si layer of island shape on the surface of a p-type Si monocrystalline substrate by proton ion implantation (Imai et al: J. Crystal Growth, Vol. 63,547 (1983)) or by epitaxial growth and patterning, then making only the p-type Si substrate porous by anodization in a HF solution so as to surround the Si island from the surface, and then dielectrically isolating the n-type Si island by accelerated oxidation. This procedure has such a problem that the isolated Si region is predetermined before the device step and the degree of freedom of device design is limited in some cases.

4. Independently from the above-mentioned conventional procedure for forming an SOI structure, a procedure for forming an SOI structure by bonding a Si monocrystalline substrate to another thermally oxidized Si monocrystalline substrate by heat treatment or an adhesive has recently attracted attention. According to this procedure it is necessary to make the active layer for the device into a uniform thin film. That is, a Si monocrystalline substrate having a thickness of several hundred microns must be made into a thin film having a thickness of micron order or less. To make such a thin film, the following two procedures are available.

(1) Thin film formation by polishing.
(2) Thin film formation by selective etching.

According to the procedure by polishing (1), it is difficult to obtain a uniform thin film. Particularly in case of thin films having a thickness of submicron order, fluctuation of thickness amounts to several tens %. That is, the poor uniformity is a problem. With increasing wafer diameter the difficulty is much pronounced.

The procedure by selective etching (2) is effective for obtaining a uniform thin film, but still has the following problems:

(i) selectivity is about $10^2$ at highest and thus is not satisfactory, (ii) surface condition is not good after the etching, and (iii) crystallinity of SOI layer is poor dur to epitaxial growth or heteroepitaxial growth on the ion-implanted, highly concentrated B-doped Si layer (C. Harendt, et. al., J. Elect. Mater. Vol. 20, 267(1991), H. Baumgart, et al., Extended Abstract of ECS 1st International Symposium of Wafer Bonding, pp-733(1991), C. E. Hunt, Extended Abstract of ECS 1st International Symposium of Wafer Bonding, pp-696(1991)).

A procedure for providing an etch-stop layer makes it possible to conduct selective etching, and includes, for example, a procedure for providing a p+ layer as an etch-stop layer (C. E. Hunt, et al., ECS 1st International Symposium on Semiconductor Wafer Bonding Science, Technology, and Applications, Abstract, p 696 (1991)). According to this procedure a p+ layer having a concentration of about $1 \times 20^{20} cm^{-2}$ is used, and the p+ layer can be formed mainly by epitaxial growth or by ion implanting.

Epitaxial growth has such a problem that Si of good crystallinity cannot be formed on the p+ layer by eiptaxial growth, whereas ion implanting has such a problem that high energy-high dose ion implanting is required for forming a low concentration layer on the surface, resulting in a higher cost and failure to make the SOI layer into a thin film.

On the other hand, U.S. Pat. No. 5,013,681 discloses a process comprising forming a mixed crystal (etch-stop layer) of Si and other group IV semiconductor on an Si substrate, then forming an Si layer thereon, bonding the Si substrate to a supporting substrate, then removing the Si substrate while using the mixed crystal as an etch-stop layer, and then removing the etch-stop layer so that the Si layer may not be etched. Specifically, selective etching of Si and SiC, Si and SiGe, or Si and SiSn, etc. are carried out. According to the process disclosed in U.S. Pat. No. 5,013,681, it is necessary to make an Si layer, which constitutes the SOI structure, to epitaxially grow on the mixed crystal of Si-Group IV semiconductor and it is very hard to prevent the crystallinity of the Si layer from deterioration. Furthermore, in U.S. Pat. No. 5,013,681, the crystallinity of the Si layer is considerably deteriorated, because the step of heteroepitaxial growth must be twice carried out, i.e. heteroepitaxial growth of mixed crystal of Si-Group IV semiconductor on the Si substrate and further heteroepitaxial growth of Si on the mixed crystal of Si-Group IV semiconductor. Furthermore, the selective etching must be carried out twice, where etching solutions having a reverse selectivity to each other must be used. For example, in case of an etch-stop layer of SiGe, the first stage selective etching requires an etching solution having a higher etching rate on Si than that on SiGe, whereas the second stage requires an etching solution having a higher etching rate on SiGe than that on Si to the contrary. The second stage etching solution must have such a considerably higher selectivity as not to etch the Si layer, and furthermore the etch-stop layer is formed from the mixed crystal of Si-Group IV semiconductor, and thus cannot have a large thickness due to the productivity, crystallinity, etc. That is, the first stage selective etching must have a higher selectivity.

The selectivity of etching depends on differences in the structure, composition, etc., and when the mixed crystal of Si-Group IV semiconductor of the etch-stop layer is rich in Si, the crystallinity of the Si layer laid thereon will be improved, but will have a poor etching selectivity. To obtain a good selectivity on the other hand, the crystalline of the Si layer will be deteriorated.

Likewise, the second stage etching (to remove SiGe) can have a selectivity of only about 13:1, and it is difficult to conduct uniform etching on a wafer scale, and such a second etching is not commercially applicable from the viewpoints of controllability, productivity and cost. Furthermore, it is difficult to detect the end point of etching, because the materials are similar to each other.

In case of a substrate of light-transmissive material, typical of which is glass, a Si thin film deposited thereon is amorphous or polycrystalline at best due to the disorder of the substrate crystal structure, and no devices of high quality can be made. This is due to the amorphous structure of the substrate, and no monocrystalline layer of good quality can be obtained merely by depositing a Si layer thereon.

The light-transmissive substrate is important when it constitutes a contact sensor as a photo receptor device, or a projection-type liquid crystal image display unit. In order to make the sensor or image element (picture element) of the display unit more dense, more resolvable or finer, a more efficient driving device is required. As a result the device provided on the light-transmissive substrate must be made from a monocrystalline layer of good crystallinity. Thus, in case of amorphous or polycrystalline Si it is difficult to make a driving device of good quality required now or in future due to the crystal structure having many defects.

SUMMARY OF THE INVENTION

An object of the present invention is to provide a process for a semiconductor device substrate which solves the above-mentioned problems of the prior art.

Another object of the present invention is to provide a process for a semiconductor device substrate capable of forming a semiconductor layer of large area and considerably less defect on an insulator.

A further object of the present invention is to provide a process for preparing a semiconductor device substrate serving as a substitute for expensive SOS or SIMOX.

A still further object of the present invention is to provide a process for preparing a semiconductor device substrate of distinguished productivity, uniformity, controllability and cost when a Si crystal layer of good crystallity equivalent to a monocrystalline wafer is formed on a transparent substrate (substrate composed of a light-transmissive material).

DETAILED DESCRIPTION OF THE PREFERRED EMBODIMENTS

Figure 1A:
FIGS. 1A to 1G are schematic cross-sectional views explaining one example of the process of the present invention.

To attain the above-mentioned objects of the present invention, the present invention provides a process for preparing a semiconductor device substrate, which comprises a step of making at least one surface of surface layers of a first substrate composed of Si material porous, a step of oxidizing inside walls of pores in the resulting porous Si layer, a step of forming a monocrystalline Si layer on the porous Si layer, a step of bonding the monocrystalline Si layer to one surface of a second substrate through an insulating layer therebetween, a first etching step of removing the first substrate by selective etching except for the porous Si layer, and a second etching step of impregnating the porous Si layer exposed by the removal of the first substrate with hydrofluoric acid or a first liquid mixture of hydrofluoric acid and at least one of an alcohol and a hydrogen peroxide solution, or by buffered hydrofluoric acid or a second liquid mixture of buffered hydrofluoric acid and at least one of an alcohol and a hydrogen peroxide solution, thereby selectively removing the porous Si layer.

The present invention is characterized by conducting two-stage selective etching to improve the selectivity at the first stage etching and accelerate the etching speed of porous Si at a high selectivity at the second stage etching, where the second stage selectivity is considerably distinguished.

To attain the objects of the present invention by forming a monocrystal on a material different from Si, the present invention further provides a process for preparing a semiconductor device substrate, which comprises a step of making at least one surface of surface layers of a first substrate composed of Si material porous, a step of oxidizing inside walls of pores in the resulting porous Si layer, a step of forming a monocrystalline Si layer on the porous Si layer, a step of bonding the surface of the monocrystalline Si layer to one surface of a second substrate composed of a light-transmissive material through an insulating layer, a first etching step of removing the first Si substrate by selective etching except for the porous Si layer, a second etching step of impregnating the porous Si layer exposed by the removal of the first Si substrate with hydrofluoric acid or a first liquid mixture of hydrofluoric acid and at least one of an alcohol and a hydrogen peroxide solution or buffered hydrofluoric acid or a second liquid mixture of buffered hydrofluoric acid and at least one of an alcohol and a hydrogen peroxide solution, thereby selectively removing the porous Si layer, and a step of increasing a bonding strength when the bonding strength obtained in the bonding step fails to reach a desired one.

Removal of the porous layer by chemical etching as an essential condition for the present process will be explained below.

Generally, porosity P can be defined by the following equation (1), and can be changed at the anodization and can be given by the following equation (2) or (3).

$$P = (2.33 - A)/2.33 \quad (1)$$

$$P = (m1 - m2)/(m1 - m3) \quad (2)$$

or $$P = (m1 - m2)/pAt \quad (3)$$

m1: total weight before anodization
m2: total weight after anodization
m3: total weight after removal of porous Si
$p$: density of monocrystalline Si
A: porous area
t: thickness of porous Si The area of porous regions is often not exactly calculated. In that case, the equation (2) is effective, but the porous Si must be etched to determine m3.

In the epitaxial growth on the porous Si, the porous Si can suppress occurrence of defects, but the porosity of Si is obviously a very important parameter, because the strains generated during the heteroepitaxial growth can be damped due to the structural properties of the porous state. Thus, the determination of the porosity is essential and indispensable in that case.

To etch the porous Si, the following procedures are known and available:

(1) Porous Si is etched with an aqueous NaOH solution (G. Bonchil, R. Herino, K. Barla, and J. C. Pfister, J. Electrochem. Soc., vol. 130, no. 7, 1611 (1983)), (2) Porous Si is etched with an etching solution capable of etching monocrystalline Si.

In the above-mentioned procedure (2), usually hydrofluoricnitric acid-based etching solution is used, and the Si etching in this case proceeds as follows:

  (4)

  (5)

where Si is oxidized by nitric acid into $SiO_2$, and the resulting $SiO_2$ is etched by hydrofluoric acid to advance Si etching.

To etch the crystalline Si, the following systems are available besides the fluoric-nitric acid-based etching solution:
Ethylenediamine system,
KOH system,
Hydrazine system, etc.

It can be seen from the foregoing that, in order to conduct selective etching of porous Si, it is necessary to select an appropriate etching solution capable of etching the porous Si and other than the above-mentioned Si etching solutions. Selective etching of porous Si conducted conventionally is etching only with an aqueous NaOH solution as an etching solution.

As mentioned above the hydrofluoric-nitric acid-based etching solution can etch porous Si as well as crystalline Si.

In the selective etching of porous Si with an aqueous NaOH solution conducted conventionally, it is inevitable that Na ions are adsorbed onto the etching surface, and the adsorbed Na ions are a main cause for impurity contamination, giving an adverse effect such as formation of a interfacial potential, etc. and thus are the substance not introduced into the semiconductor process.

EMBODIMENT 1

A Si substrate is made porous by anodization in an HF solution. The density of the porous Si layer can be changed in a range of 1.1 to 0.6 g/cm³ by changing the concentration of the HF solution in a range of 50 to 20% in contrast to the density of monocrystalline Si, i.e. 2.33 g/cm³. The porous Si layer is not formed on an n-type Si layer, but formed only on p-type Si substrate for the following reasons. Observation by a transmission electron microscope reveals that the porous Si layer has pores having an average diameter of about 600 Å.

Porous Si was discovered by Uhlir et al during the research on electrolytic polishing of semiconductors in 1956 (A. Uhlir, Bell Syst. Tech. J. Vol. 35,333 (1956)).

Unagami et al studied the dissolving reaction of Si in the anodization and reported that positive holes are necessary for the anodic reaction of Si in an HF solution and the reaction proceeds as follows (T. Unagami, J. Electrochem. Soc., Vol. 127,476 (1980)):

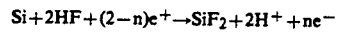

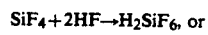

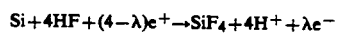

wherein $e^+$ and $e^-$ represent a positive hole and an electron, respectively, and n and λ are numbers of positive holes required for dissolving one atom of silicon, respectively, and it is postulated that porous Si is formed when a condition of $n>2$ or $\lambda>4$ is satisfied.

It can be seen from the foregoing that p-type Si having positive holes can be made porous, whereas n-type Si cannot be made porous. Selectivity in the porous structure formation has been verified by Nagano et al and Imai (Nagano, Nakajima, Yasuno, Ohnaka, Kajiwara: Denshi Tsushin Gakkai Gijutsu Kenkyu Hokoku, Vol. 79, SSD 79-9549 (1979) and K. Imai: Solid-state Electronics Vol. 24,159 (1981)).

However, it was reported that highly concentrated n-type Si can be made porous (R. P. Holmstrom and J. Y. Chi, Appl. Phys. Lett., Vol. 42,386 (1983)), and it is important to select a substrate that can be made porous, irrespective of p-type and n-type.

Observation of porous Si layer by a transmission electron microscope revealed that pores having an average diameter of about 600 Å are formed in the porous Si layer, and the monocristallinity is retained in the porous Si layer though its density is less than a half of monocrystalline Si, and thus a monocrystalline Si layer can be made to epitaxially grow on the porous layer. Above 1000° C., rearrangement of inside pores takes place, and the characteristics of accelerated etching are deteriorated. Thus, for the epitaxial growth of the Si layer, a low temperature growth such as molecular beam epitaxial growth, plasma CVD, low pressure CVD, photo CVD, bias sputtering, liquid phase growth, etc. is suitable.

Since the porous Si layer contains a large amount of voids at its inside, the density is reduced to less than a half of the monocrystalline Si, and consequently the surface area is remarkably increased and the chemical etching rate is considerably accelerated, as compared with the etching rate of normal monocrystalline Si layer.

Figure 1B:
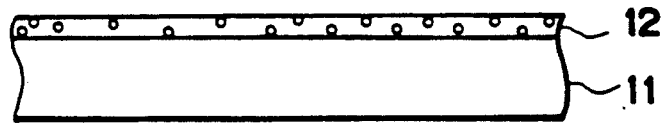
Figure 1C:
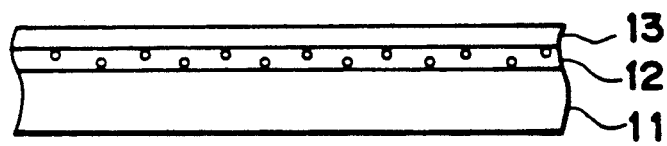
Figure 1D:
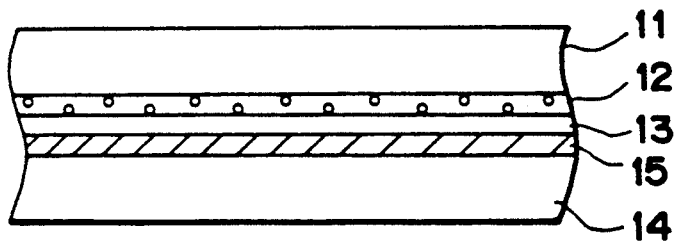
Figure 1E:
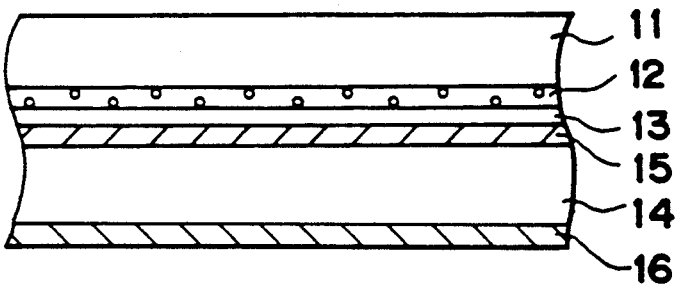

FIGS. 1A to 1G are step view explaining the process of the present invention. As shown in FIG. 1A a Si monocrystalline substrate 11 was used as a first substrate, and as shown in FIG. 1B its surface layer was made porous and an oxide film was formed on the inside walls of pores in the porous Si layer 12. Furthermore, a monocrystalline Si layer 13 was formed on the porous Si layer 12 (FIG. 1C). As shown in FIG. 1D, another Si supporting substrate 14 as a second substrate was brought in tight contact with the monocrystalline Si layer 13 through an insulating layer 15 at room temperature and bonded thereto by anodic bonding, compression or heat treatment or a combination thereof, whereby the Si supporting substrate 14 and the monocrystalline Si layer 13 could be strongly bonded to each other through the insulating layer 15. The insulating layer 15 was formed on at least one of the monocrystalline Si layer and the Si supporting substrate 14, or an insulating thin plate was provided as an insulating layer 15 between the Si support substrate 14 and the monocrystalline Si layer 13 to bond to these layers.

Figure 1F:
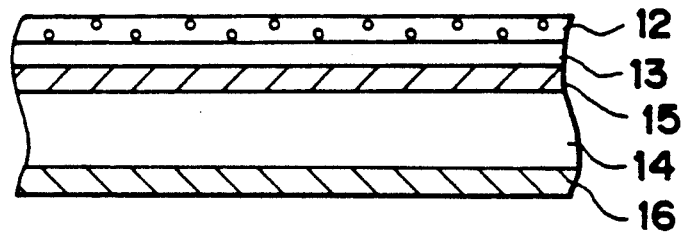

Only the surface of the Si supporting substrate of bonded substrates was coated with an etching-resistant mask 16 (FIG. 1E) and the monocrystalline Si substrate 11 was removed by etching while using the porous Si layer 12 as an etch-stop layer (FIG. 1F).

The first selective etching was carried out with an etching solution of fluoro-nitric acid system or ethylenediamine+pyrocatechol+water, or KOH system or the like, which had a higher etching rate on Si than on $SiO_2$.

Furthermore, only porous Si layer 12 was subjected to electroless, wet, chemical etching with at least one of the following 8 kinds of selective etching solutions on the porous Si to retain and form the monocrystalline Si layer 13 in a thin film state on the insulating substrate 15+14.

Figure 1G:
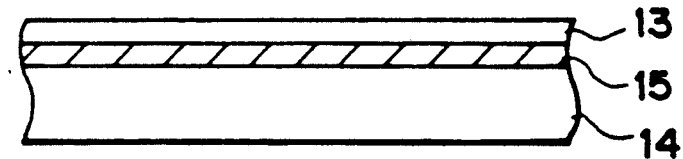

FIG. 1G shows a semiconductor device substrate obtained according to the present invention after removing the mask 16, where the monocrystalline Si layer 13 was formed as a flat, uniform thin film on the insulating substrate 15+14 throughout the wafer in a large area. The thus obtained semiconductor device substrate could be suitably used even from the viewpoint of preparing dielectrically isolated electronic devices.

Selective etching procedure for electroless, wet etching of only porous Si will be explained below.

Figure 4:
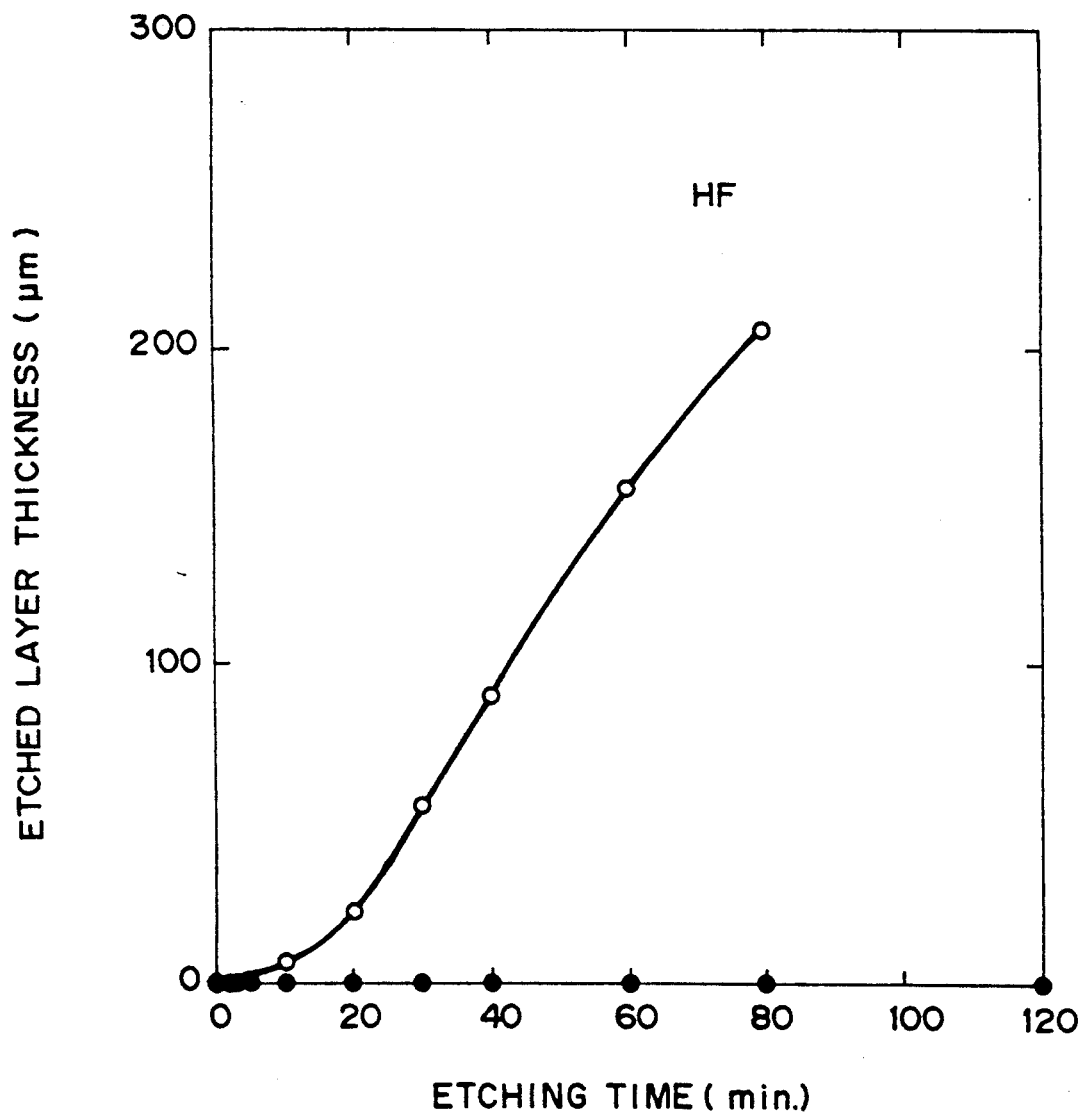
FIG. 4 is a diagram showing etching characteristics of porous Si and nonporous Si against hydrofluoric acid.

FIG. 4 shows etching time dependency of the thicknesses (etching depths) of etched porous Si and monocrystalline Si when porous Si and monocrystalline Si were impregnated with 49% hydrofluoric acid with stirring. The porous Si was prepared by anodizing the monocrystalline Si under the following conditions. Starting material for the porous Si to be formed by anodization is not limited to monocrystalline Si, but can be Si of other crystal structure.
Applied voltage: 2.6 V
Current density: 30 mA·cm$^{-2}$
Anodizing solution: HF:$H_2O$:$C_2H_5OH$=1:1:1
Time: 2.4 hours
Thickness of porous Si: 300 μm
Porosity: 56%

The porous Si prepared under the abovementioned conditions was impregnated with 49% hydrofluoric acid at room temperature with stirring (white dots in FIG. 4). Then, decrease in the thickness of the porous Si was measured. The porous Si was rapidly etched, for example, to a decrease in thickness of 90 μm for about 40 minutes and to a decrease in thickness of 205 μm for 80 minutes. Uniform etching was obtained with a surface flatness of high level. Etching rate was dependent on a solution concentration and temperature.

Non-porous Si having a thickness of 500 μm was impregnated with 49% hydrofluoric acid at room temperature with stirring (black dots in FIG. 4). Then the thickness of the nonporous Si was measured. The nonporous Si was etched to a depth of only less than 50 Å even for 80 minutes.

The etched porous Si and nonporous Si were washed with water and their surface were microanalyzed with secondary ions, and no impurities were detected at all.

Conditions of solution concentration and temperature were set within such a range that the etching rate of porous Si and etching selectivity of porous Si to nonporous Si are practically not objectionable in view of the process steps, etc.

Figure 5:
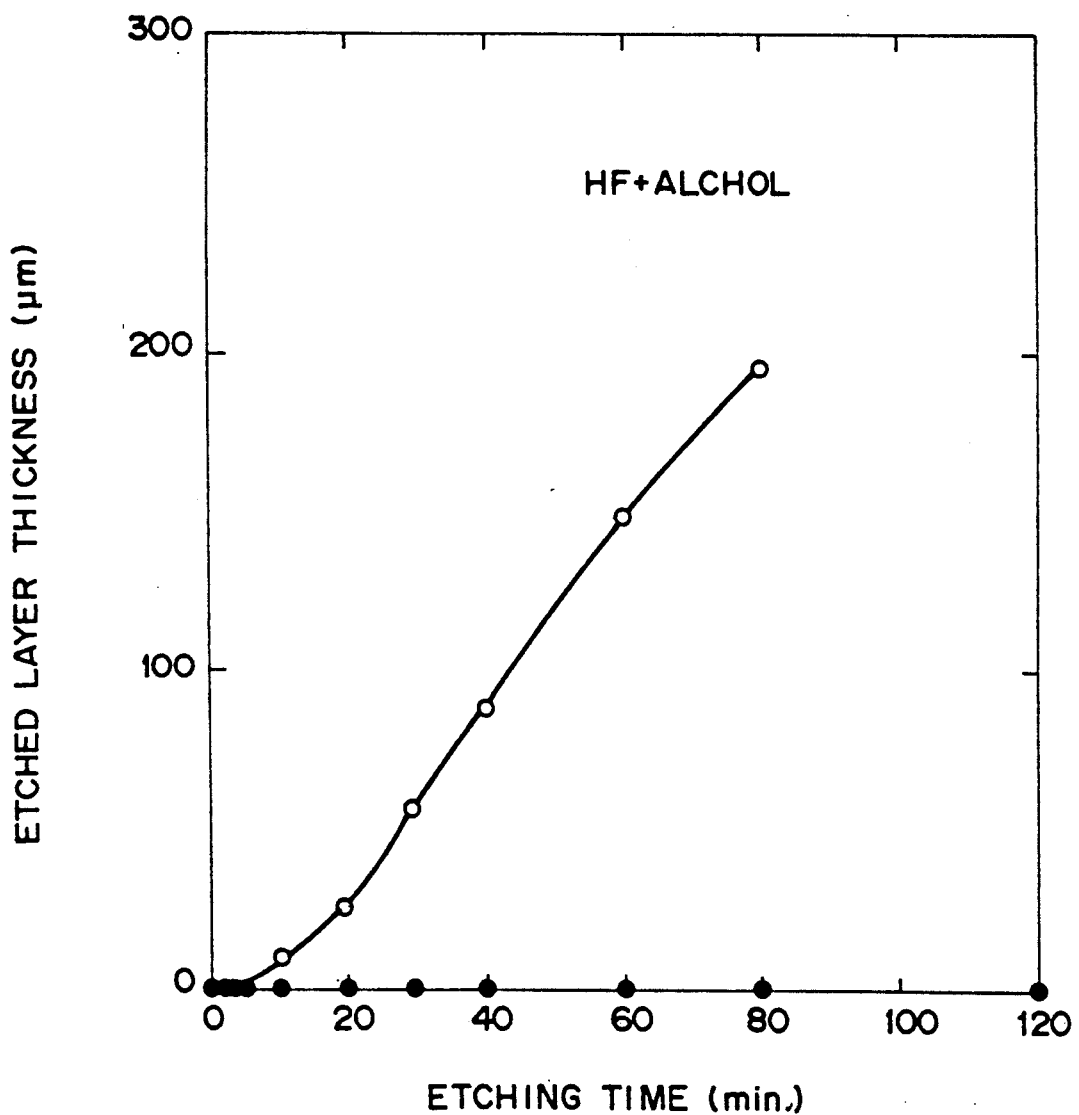
FIG. 5 is a diagram showing etching characteristics of porous Si and nonporous Si against a liquid mixture of hydrofluoric acid and alcohol.

FIG. 5 shows etching time dependency of the thicknesses of etched porous Si and monocrystalline Si when porous Si and monocrystalline Si were impregnated with a solution mixture of 49% hydrofluoric acid and an alcohol (10:1) without stirring. The porous Si was prepared by anodizing the monocrystalline Si under the following conditions. Starting material for the porous Si to be formed by anodization is not limited to monocrystalline Si, but can be Si of other crystal structure.
Applied voltage: 2.6 V
Current density: 30 mA·cm$^{-2}$
Anodizing solution: HF:$H_2O$:$C_2H_5OH$=1:1:1
Time: 2.4 hours
Thickness of porous Si: 300 μm
Porosity: 56%

The porous Si prepared under the above-mentioned conditions was impregnated with a liquid mixture of 49% hydrofluoric acid and an alcohol (10:1) at room temperature without stirring (white dots in FIG. 5). Then, decrease in the thickness of the porous Si was measured. The porous Si was rapidly etched, for example, to a decrease in thickness of 85 μm for about 40 minutes and to a decrease in thickness of 195 μm for 80 minutes. Uniform etching was obtained with a surface flatness of high level. Etching rate was dependent on a solution concentration and temperature.

Non-porous Si having a thickness of 500 μm was impregnated with a liquid mixture of 49% hydrofluoric acid and an alcohol (10:1) at room temperature without stirring (black dots in FIG. 5). Then the thickness of the nonporous Si was measured. The nonporous Si was etched to a depth of only less than 50 Å even for 80 minutes.

Particularly, bubbles of reaction product gases by the etching could be instantaneously removed from the etched surface by addition of an alcohol without stirring, and the porous Si could be uniformly and efficiently removed.

The etched porous Si and nonporous Si were washed with water and their surfaces were microanalyzed with secondary ions, and no inpurities were detected at all.

Conditions of solution concentration and temperature were set within such a range that the etching rate of porous Si and etching selectivity of porous Si to nonporous Si are practically not objectionable in view of the process steps, etc. and that the above-mentioned alcohol is effective.

Figure 6:
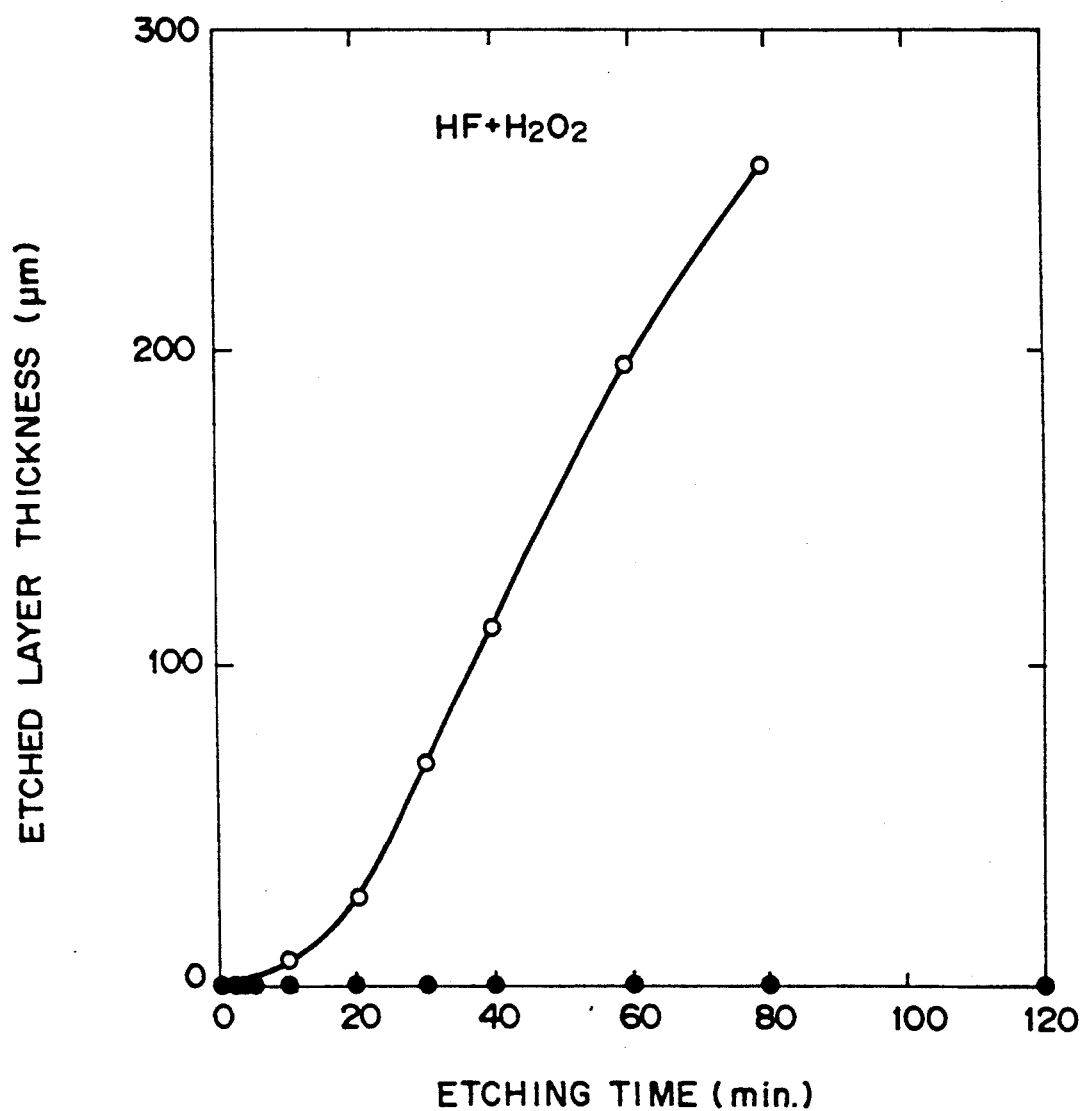
FIG. 6 is a diagram showing etching characteristics of porous Si and nonporous Si against a liquid mixture of hydrofluoric acid and hydrogen peroxide solution.

FIG. 6 shows etching time dependency of the thicknesses of etched porous Si and monocrystalline Si when porous Si and monocrystalline Si were impregnated with a liquid mixture of 49% hydrofluoric acid and 30% hydrogen peroxide solution (1:5) with stirring. The porous Si was prepared by anodizing the monocrystalline Si under the following conditions. Starting material for the porous Si to be formed by anodization is not limited to monocrystalline Si, but can be Si of other crystal structure.
Applied voltage: 2.6 V
Current density: 30 mA·cm$^{-2}$
Anodizing solution: HF:$H_2O$:$C_2H_5OH$=1:1:1
Time: 2.4 hours
Thickness of porous Si: 300 μm
Porosity: 56%

The porous Si prepared under the above-mentioned conditions was impregnated with a liquid mixture of 49% hydrofluoric acid and 30% hydrogen peroxide solution (1:5) at room temperature with stirring (white dots in FIG. 6). Then, decrease in the thickness of the porous Si was measured. The porous Si was rapidly etched, for example, to a decrease in thickness of 112 μm for about 40 minutes and to a decrease in thickness of 256 μm for 80 minutes. Uniform etching was obtained with a surface flatness of high level. Etching rate was dependent on a solution concentration and temperature.

Non-porous Si having a thickness of 500 μm was impregnated with a liquid mixture of 49% hydrofluoric acid and 30% hydrogen fluoride solution (1:5) at room temperature with stirring (black dots in FIG. 6). Then the thickness of the nonporous Si was measured. The nonporous Si was etched to a depth of only less than 50 Å even for 80 minutes.

Particularly, the oxidation of silicon could be accelerated by addition of a hydrogen peroxide solution, and the reaction rate could be accelerated as compared with that without the addition of hydrogen peroxide. Furthermore, the reaction rate could be controlled by changing the mixing ratio of the hydrogen peroxide solution.

The etched porous Si and nonporous Si were washed with water and their surfaces were microanalyzed with secondary ions, and no impurities were defected at all.

Conditions of solution concentration and temperature were set within such a range that the etching rate of porous Si and etching selectivity of porous Si to nonporous Si are practically not objectionable in view of the process steps, etc.

Figure 7:
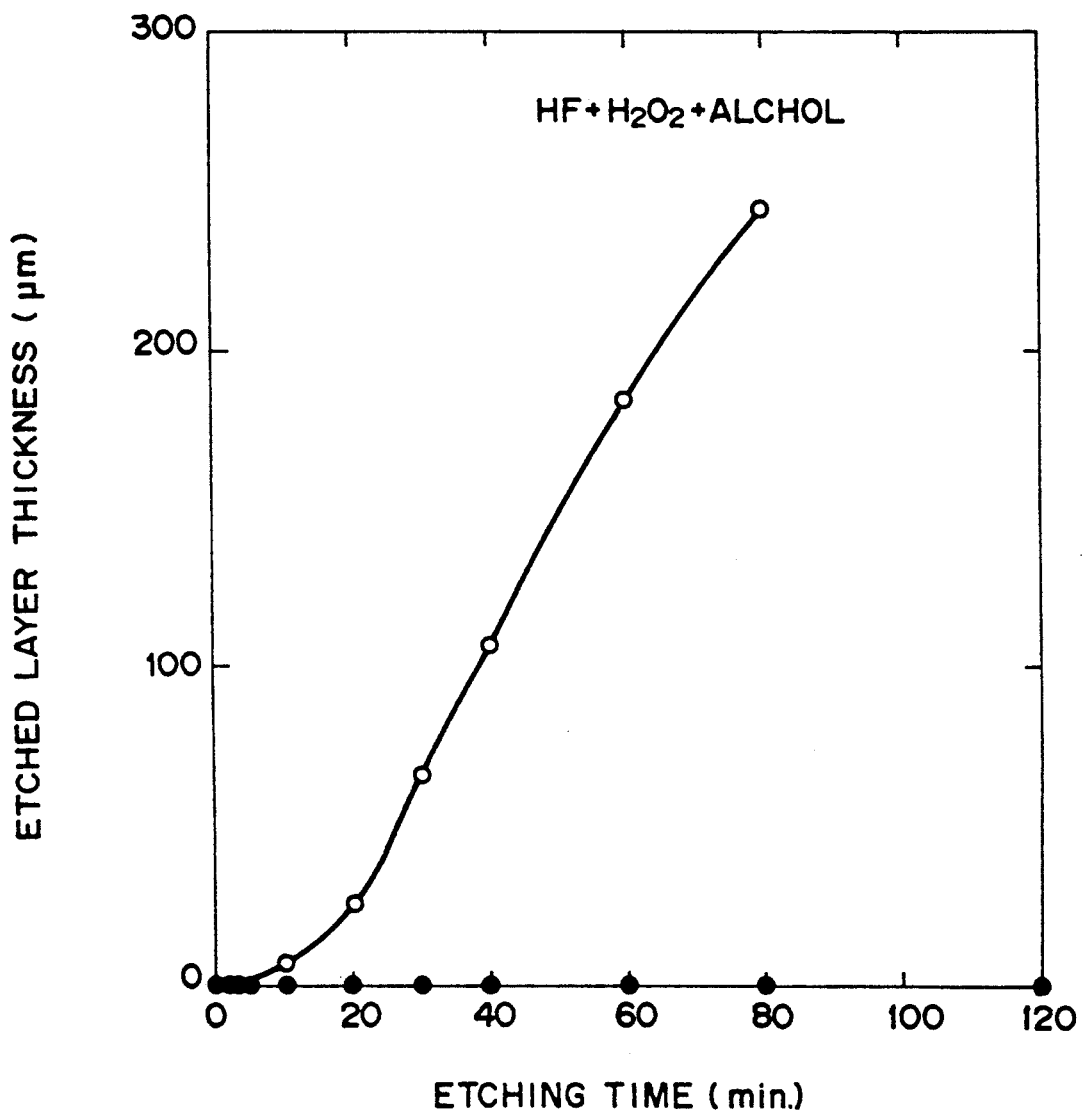
FIG. 7 is a diagram showing etching characteristics of porous Si and nonporous Si against a liquid mixture of hydrofluoric acid, alcohol and hydrogen peroxide solution.

FIG. 7 shows etching the dependency of the thicknesses of etched porous Si and monocrystalline Si when porous Si and monocrystalline Si were impregnated with a liquid mixture of with 49% hydrofluoric acid, an alcohol and 30% hydrogen peroxide solution (10:6:50) without stirring. The porous Si was prepared by anodizing the monocrystalline Si under the following conditions. Starting material for the porous Si to be formed by anodization is not limited to monocrystalline Si, but can be Si of other crystal structure.
Applied voltage: 2.6 V
Current density: 30 mA·cm$^{-2}$
Anodizing solution: HF:H$_2$O:C$_2$H$_5$OH=1:1:1
Time: 2.4 hours
Thickness of porous Si: 300 μm
Porosity: 56%

The porous Si prepared under the above-mentioned conditions was impregnated with a liquid mixture of 49% hydrofluoric acid, an alcohol and 30% hydrogen peroxide solution (10:6:50) at room temperature without stirring (white dots in FIG. 7). Then, decrease in the thickness of the porous Si was measured. The porous Si was rapidly etched, for example, to a decrease in thickness of 107 μm for about 40 minutes and to a decrease in thickness of 244 μm for 80 minutes. Uniform etching was obtained with a surface flatness of high level. Etching rate was dependent on a solution concentration and temperature.

Non-porous Si having a thickness of 500 μm was impregnated with 49% hydrofluoric acid, an alcohol and 30% hydrogen peroxide solution (10:6:50) at room temperature without stirring (black dots in FIG. 7). Then the thickness of the nonporous Si was measured. The nonporous Si was etched to a depth of only less than 50 Å even for 80 minutes.

Particularly, the oxidation of silicon could be accelerated by addition of a hydrogen peroxide solution, and the reaction rate could be accelerated as compared with that without the addition of hydrogen peroxide. Furthermore, the reaction rate could be controlled by changing the mixing ratio of the hydrogen peroxide solution.

Particularly, bubbles of reaction product gases by the etching could be instantaneously removed from the etched surface by addition of an alcohol without stirring, and the porous Si could be uniformly and efficiently removed.

The etched porous Si and nonporous Si were washed with water and their surfaces were microanalyzed with secondary ions, and no impurities were defected at all.

Conditions of solution concentration and temperature were set within such a range that the etching rate of porous Si and etching selectivity of porous Si to nonporous Si are practically not objectionable in view of the process steps, etc. and that the above-mentioned alcohol is effective.

Figure 8:
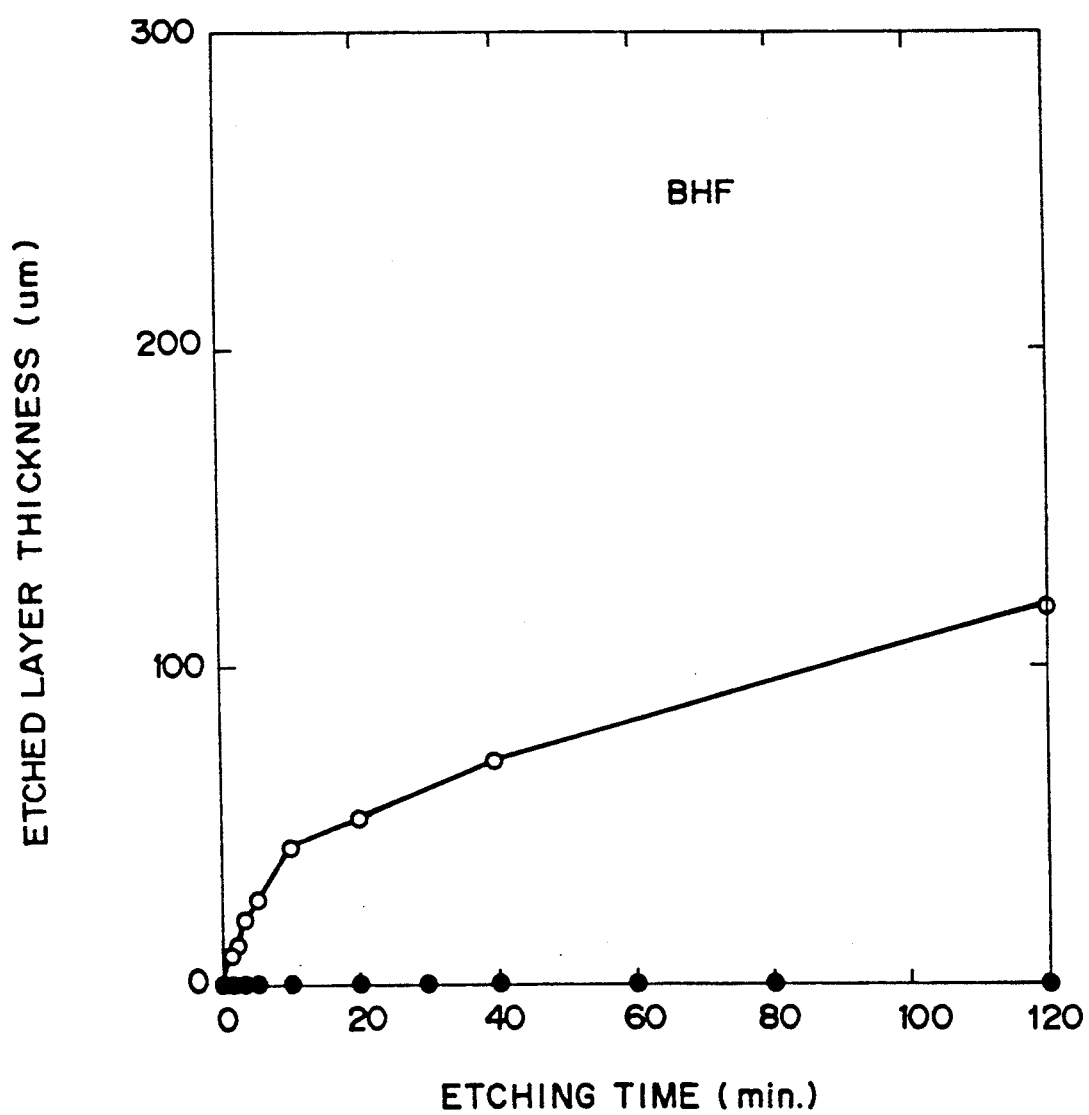
FIG. 8 is a diagram showing etching characteristics of porous Si and nonporous Si against buffered hydrofluoric acid.

FIG. 8 shows etching time dependency of the thicknesses of etched porous Si and monocrystalline Si when porous Si and monocrystalline Si were impregnated with buffered hydrofluoric acid (NH$_4$F: 36%; HF: 4.5%) with stirring. The porous Si was prepared by anodizing the monocrystalline Si under the following conditions. Starting material for the porous Si to be formed by anodization is not limited to monocrystalline Si, but can be Si of other crystal structure.
Applied voltage: 2.6 V
Current density: 30 mA·cm$^{-2}$
Anodizing solution: HF:H$_2$O:C$_2$H$_5$OH=1:1:1
Time: 2.4 hours
Thickness of porous Si: 300 μm
Porosity: 56%

The porous Si prepared under the above-mentioned conditions was impregnated with buffered hydrofluoric acid at room temperature with stirring (white dots in FIG. 8). Then, decrease in the thickness of the porous Si was measured. The porous Si was rapidly etched, for example, to a decrease in thickness of 70 μm for about 40 minutes and to a decrease in thickness of 118 μm for 80 minutes. Uniform etching was obtained with a surface flatness of high level. Etching rate was dependent on a solution concentration and temperature.

Non-porous Si having a thickness of 500 μm was impregnated with buffered hydrofluoric acid at room temperature with stirring (black dots in FIG. 8). Then the thickness of the nonporous Si was measured. The nonporous Si was etched to a depth of only less than 50 Å even for 120 minutes.

The etched porous Si and nonporous Si were washed with water and their surfaces were microanalyzed with secondary ions, and no impurities were defected at all.

Conditions of solution concentration and temperature were set within such a range that the etching rate of porous Si and etching selectivity of porous Si to nonporous Si are practically not objectionable in view of the process steps. etc.

Figure 9:
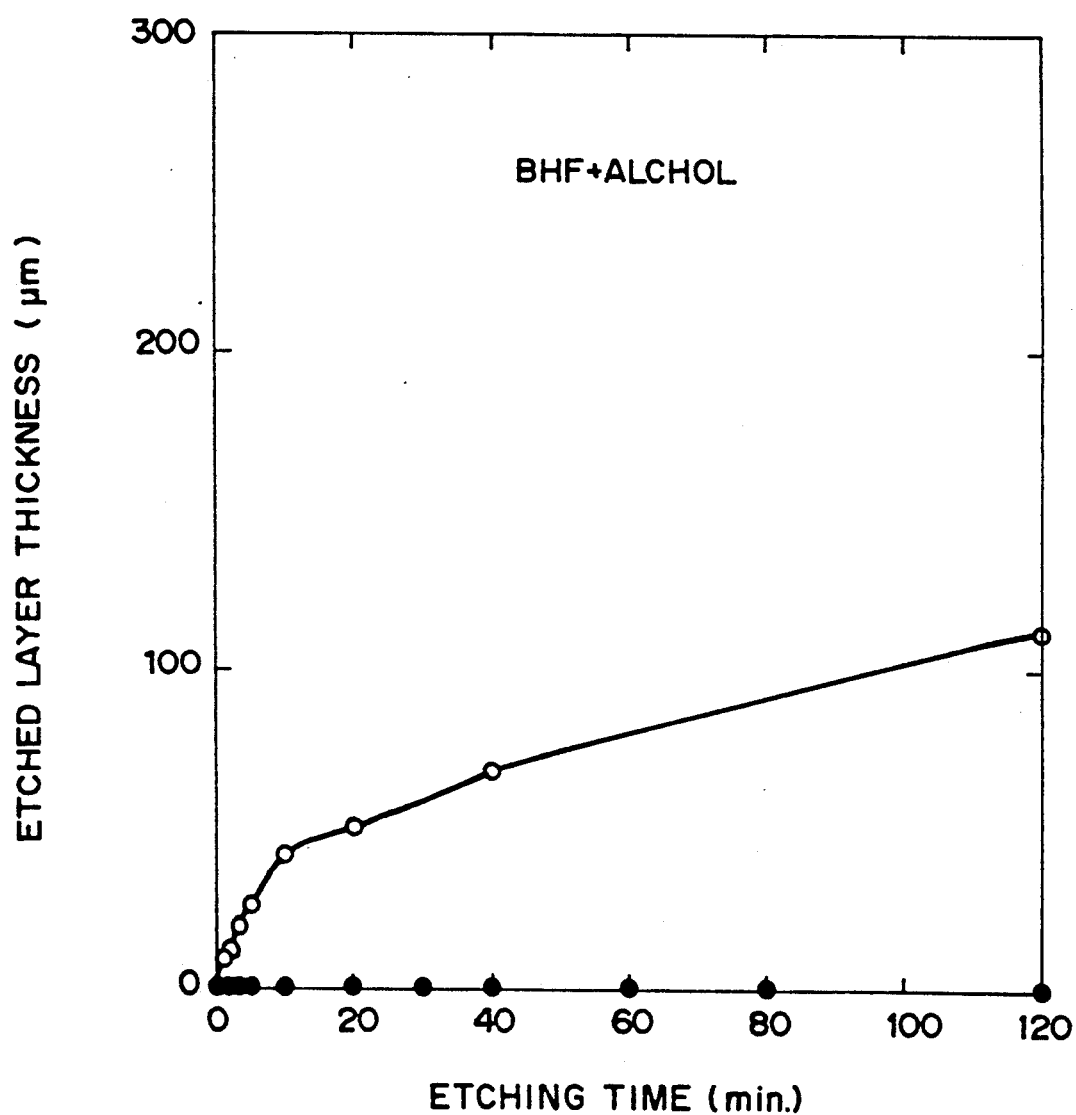
FIG. 9 is a diagram showing etching characteristics of porous Si and nonporous Si against a liquid mixture of buffered hydrofluoric acid and alcohol.

FIG. 9 shows etching time dependency of the thicknesses of etched porous Si and monocrystalline Si when porous Si and monocrystalline Si were impregnated with a liquid mixture of buffered hydrofluoric acid (NH$_4$F: 36%; HF: 4.5%) and an alcohol (10:1) without stirring. The porous Si was prepared by anodizing the monocrystalline Si under the following conditions. Starting material for the porous Si to be formed by anodization is not limited to monocrystalline Si, but can be Si of other crystal structure.
Applied voltage: 2.6 V
Current density: 30 mA·cm$^{-2}$
Anodizing solution: HF:H$_2$O:C$_2$H$_5$OH=1:1:1
Time: 2.4 hours
Thickness of porous Si: 300 μm
Porosity: 56%

The porous Si prepared under the above-mentioned conditions was impregnated with a liquid mixture of buffered hydrofluoric acid and an alcohol at room temperature without stirring (10:1) (white dots in FIG. 9). Then, decrease in the thickness of the porous Si was measured. The porous Si was rapidly etched, for example, to a decrease in thickness of 67 μm for about 40 minutes and to a decrease in thickness of 112 μm for 120 minutes. Uniform etching was obtained with a surface flatness of high level. Etching rate was dependent on a solution concentration and temperature.

Non-porous Si having a thickness of 500 μm was impregnated with a liquid mixture of buffered hydrofluoric acid and an alcohol (10:1) at room temperature without stirring (black dots in FIG. 9). Then the thickness of the nonporous Si was measured. The nonporous Si was etched to a depth of only less than 50 Å even for 120 minutes.

Particularly, bubbles of reaction product gases by the etching could be instantaneously removed from the etched surface by addition of an alcohol without stirring, and the porous Si could be uniformly and efficiently removed.

The etched porous Si and nonporous Si were washed with water and their surfaces were microanalyzed with secondary ions, and no impurities were detected at all.

Conditions of solution concentration and temperature were set within such a range that the etching rate of porous Si and etching selectivity of porous Si to nonporous Si are practically not objectionable in view of the process steps, etc. and that the above-mentioned alcohol is effective.

Figure 10:
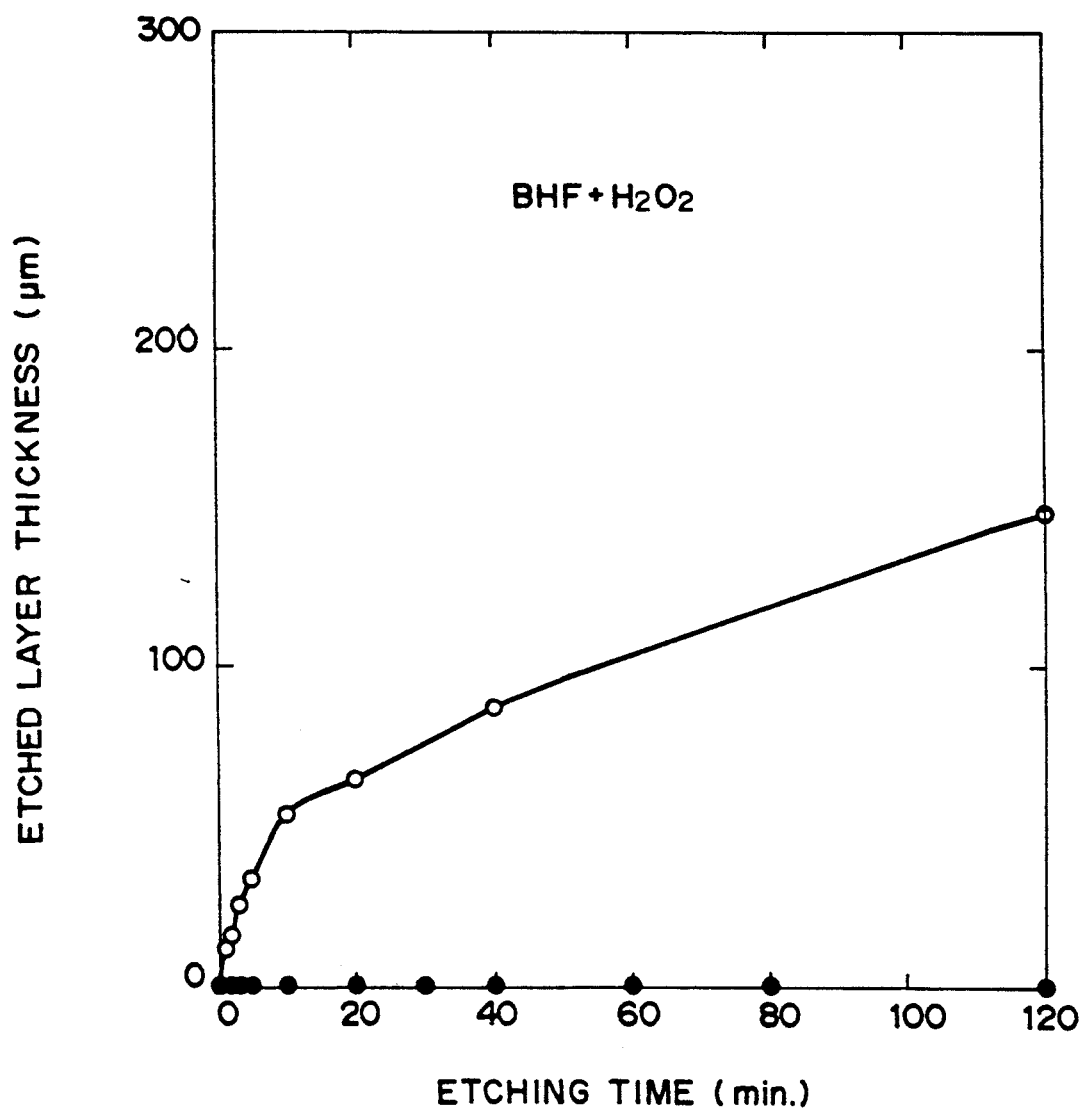
FIG. 10 is a diagram showing etching characteristics of porous Si and nonporous Si against a liquid mixture of buffered hydrofluoric acid and hydrogen peroxides solution.

FIG. 10 shows etching time dependency of the thicknesses of etched porous Si and monocrystalline Si when porous Si and monocrystalline Si were impregnated with a liquid mixture of buffered hydrofluoric acid (NH$_4$F: 36%; HF: 4.5%) and 30% hydrogen peroxide solution (1:5) with stirring. The porous Si was prepared by anodizing the monocrystalline Si under the following conditions. Starting material for the porous Si to be formed by anodization is not limited to monocrystalline Si, but can be Si of other crystal structure.
Applied voltage: 2.6 V
Current density: 30 mA cm$^{-2}$
Anodizing solution: HF:H$_2$O:C$_2$H$_5$OH=1.1:1
Time: 2.4 hours
Thickness or porous Si: 300 μm
Porosity 56%

The porous Si prepared under the above-mentioned conditions was impregnated with the liquid mixture of buffered hydrofluoric acid and 30% hydrogen peroxide solution (1:5) at room temperature with stirring (white dots in FIG. 10). Then, decrease in the thickness of the porous Si was measured. The porous Si was rapidly etched, for example, to a decrease in thickness of 88 μm for about 40 minutes and to a decrease in thickness of 147 μm for 120 minutes. Uniform etching was obtained with a surface flatness of high level. Etching rate was dependent on a solution concentration and temperature.

Non-porous Si having a thickness of 500 μm was impregnated with a liquid mixture of buffered hydrofluoric acid and 30% hydrogen peroxide solution (1:5) at room temperature with stirring (black dots in FIG. 10). Then the thickness of the nonporous Si was measured. The nonporous Si was etched to a depth of only less than 50 Å even for 120 minutes.

Particularly, the oxidation of silicon could be accelerated by addition of a hydrogen peroxide solution, and the reaction rate could be accelerated as compared with that without the addition of hydrogen peroxide. Furthermore, the reaction rate could be controlled by changing the mixing ratio of the hydrogen peroxide solution.

The etched porous Si and nonporous Si were washed with water and their surfaces were microanalyzed with secondary ions, and no impurities were detected at all.

Conditions of solution concentration and temperature were set within such a range that the etching rate of porous Si and etching selectivity of porous Si to monoporous Si are practically not objectionable in view of the process steps, etc. and that the above-mentioned alcohol is effective.

Figure 11:
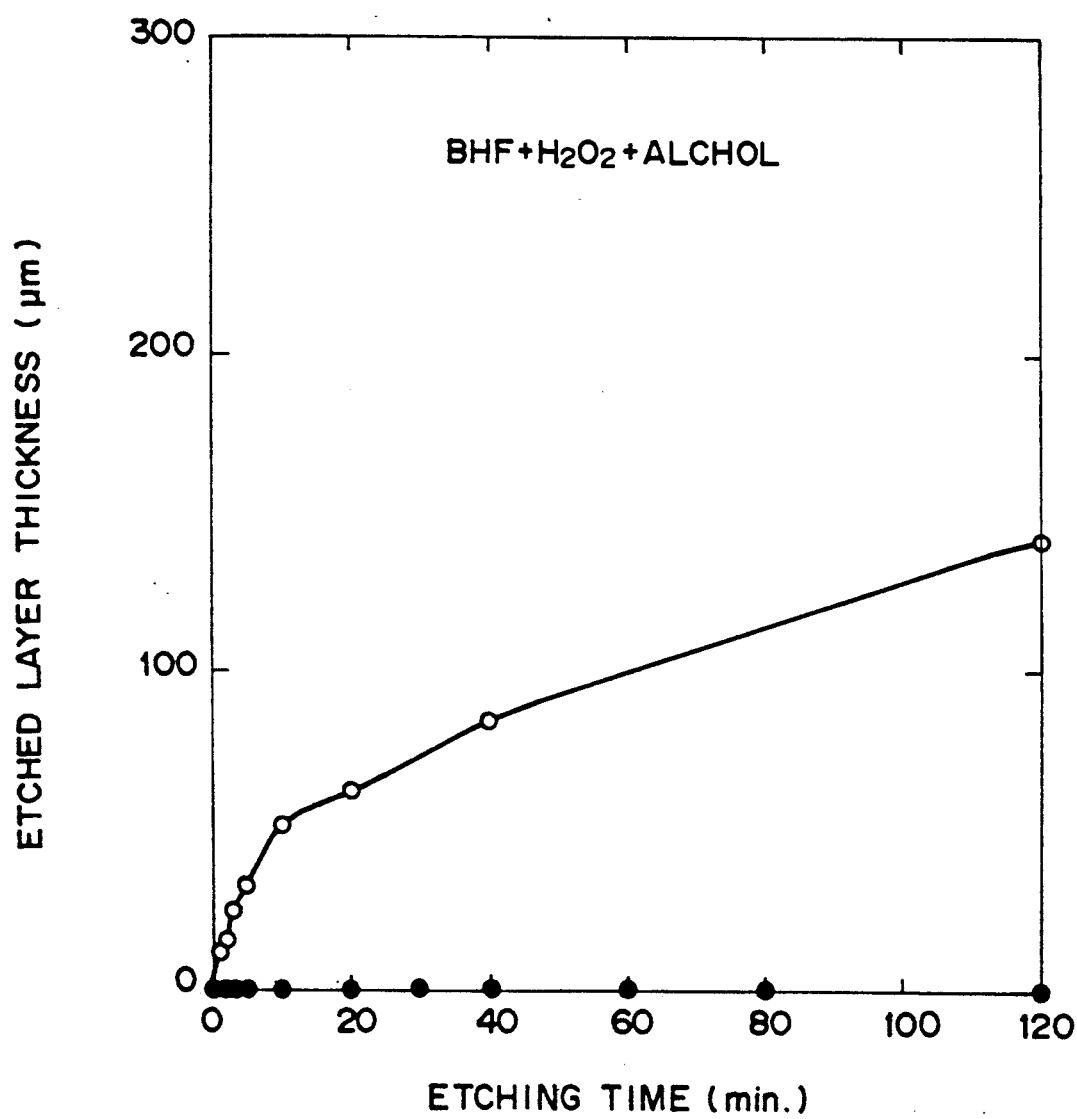
FIG. 11 is a diagram showing etching characteristics of porous Si and nonporous Si against a liquid mixture of buffered hydrofluoric acid, alcohol and hydrogen peroxide solution

FIG. 11 shows etching time dependency of the thicknesses of etched porous Si and monocrystalline Si when porous Si and monocrystalline Si were impregnated with a liquid mixture of buffered hydrofluoric acid (NH$_4$H: 36%; HF: 4.5%), an alcohol and 30% hydrogen peroxide solution (10:6:50) without stirring. The porous Si was prepared by anodizing the monocrystalline Si under the following conditions. Starting material for the porous Si to be formed by anodization is not limited to monocrystalline Si, but can be Si of other crystal structure.
Applied voltage: 2.6 V
Current density: 30 mA·cm$^{-2}$
Anodizing solution: HF:H$_2$O:C$_2$H$_5$OH=1:1:1
Time: 2.4 hours
Thickness of porous Si: 300 μm
Porosity: 56%

The porous Si prepared under the above-mentioned conditions was impregnated with a liquid mixture of buffered hydrofluoric acid, an alcohol and 30% hydrogen peroxide solution at room temperature without stirring (white dots in FIG. 11). Then, decrease in the thickness of the porous Si was measured. The porous Si was rapidly etched, for example, to a decrease in thickness of 83 μm for about 40 minutes and to a decrease in thickness of 140 μm for 120 minutes. Uniform etching was obtained with a surface flatness of high level. Etching rate was dependent on a solution concentration and temperature.

Non-porous Si having a thickness of 500 μm was impregnated with the liquid mixture of buffered hydrofluoric acid, an alcohol and 30% hydrogen peroxide solution (10:6:50) at room temperature without stirring (black dots in FIG. 11). Then the thickness of the nonporous Si was measured. The nonporous Si was etched to a depth of only less than 50 Å even for 120 minutes.

Particularly, the oxidation of silicon could be accelerated by addition of a hydrogen peroxide solution, and the reaction rate could be accelerated as compared with that without the addition of hydrogen peroxide. Furthermore, the reaction rate could be controlled by changing the mixing ratio of the hydrogen peroxide solution.

Particularly, bubbles of reaction product gases by the etching could be instantaneously removed from the etched surface by addition of the alcohol without stirring, and the porous Si could be uniformly and efficiently removed.

The etched porous Si and nonporous Si were washed with water and their surface were microanalyzed with secondary ions, and no impurities were defected at all.

Conditions of solution concentration and temperature were set within such a range that the etching rate of porous Si and etching selectivity of porous Si to nonporous Si are practically not objectionable in view of the process steps, etc. and that the above-mentioned alcohol is effective.

EMBODIMENT 2

Figure 2A:
FIGS. 2A to 2G are schematic cross-sectional views explaining one example of the process of the present invention.
Figure 2B:
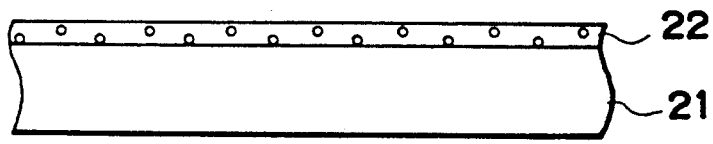
Figure 2C:
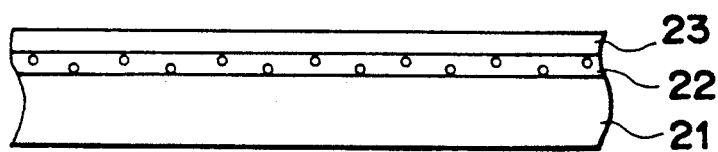
Figure 2D:
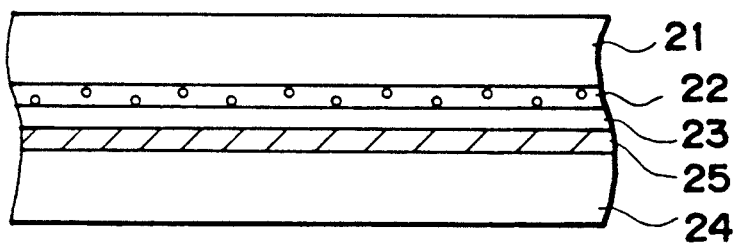

As shown in FIG. 2A a Si monocrystalline substrate 21 was used, and as shown in FIG. 2B its surface layer was made porous and an oxide film was formed on the inside walls of pores in the porous Si layer 22. Furthermore, a monocrystalline Si layer 23 was formed on the porous Si layer 22 (FIG. 2C). As shown in FIG. 2D, another Si supporting substrate 24 was brought in tight contact with the monocrystalline Si layer 23 through an insulating layer 25 at room temperature and bonded thereto by anodic bonding, compression or heat treatment or a combination thereof, whereby the Si supporting substrate 24 and the monocrystalline Si layer 23 could be strongly bonded to each other through the insulating layer 25. The insulating layer 25 was formed on at least one of the monocrystalline Si layer and the Si supporting substrate 24, or an insulating thin plate was provided as an insulating layer 25 between the Si supporting substrate 24 and the monocrystalline Si layer 23 to bond to these layers.

Figure 2E:
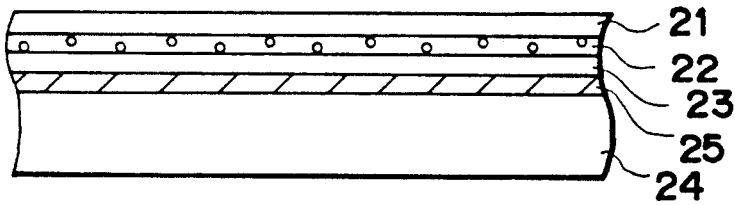
Figure 2F:
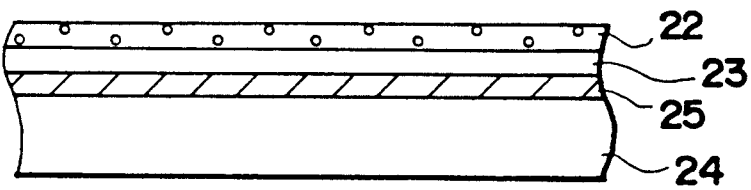

Then, the Si monocrystalline substrate 21 was removed by grinding and polishing to a depth just before the porous Si layer was exposed (FIG. 2E) and the remaining monocrystalline Si substrate 21 was removed by etching while using the porous Si layer 22 as an etch-stop layer (FIG. 2F).

The first selective etching was carried our with an etching solution of fluoro-nitric acid system or ethylenediamine+pyrocatechol+water, or KOH system or the like, which has a higher etching rate on Si than on $SiO_2$.

Furthermore, only porous Si layer 22 was subjected to electroless, wet, chemical etching with at least one of the above-mentioned 8 kinds of selective etching solutions on the porous Si to retain and form the monocrystalline Si layer 23 in a thin film state on the insulating substrate 25+24.

Figure 2G:
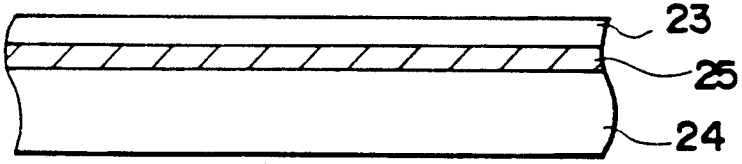

FIG. 2G shows a semiconductor device substrate obtained according to the present invention, where the monocrystalline Si layer 23 was formed as a flat, uniform thin film on the insulating substrate 25+24 throughout the wafer in a layer area. The thus obtained semiconductor device substrate could be suitably used even from the viewpoint of preparing dielectrically isolated electric devices.

EMBODIMENT 3

Figure 3A:
FIGS. 3A to 3G are schematic cross-sectional views explaining one example of the process of the present invention
Figure 3B:
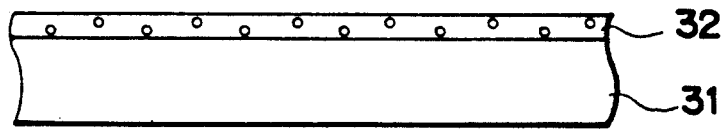
Figure 3C:
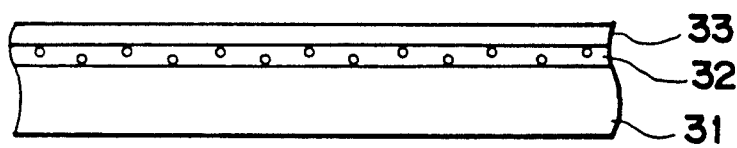
Figure 3D:
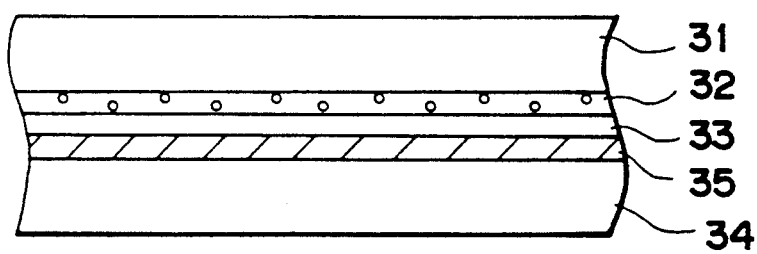

As shown in FIG. 3A a Si monocrystalline substrate 31 was used, and as shown in FIG. 3B its surface layer was made porous and an oxide film was formed on the inside walls of pores in the porous Si layer 32. Furthermore, a monocrystalline Si layer 33 was formed on the porous Si layer 32 (FIG. 3C). As shown in FIG. 3D, another Si supporting substrate 34 was brought in tight contact with the monocrystalline Si layer 33 through an insulating layer 35 at room temperature and bonded thereto by anodic bonding, compression or heat treatment or a combination thereof, whereby the Si supporting substrate 34 and the monocrystalline Si layer 33 could be strongly bonded to each other through the insulating layer 35. The insulating layer 35 was formed on at least one of the monocrystalline Si layer and the Si supporting substrate 34, or an insulating thin plate is provided as an insulating layer 15 between the Si supporting substrate 34 to the monocrystalline Si layer 33 to bond to these layers.

Figure 3E:
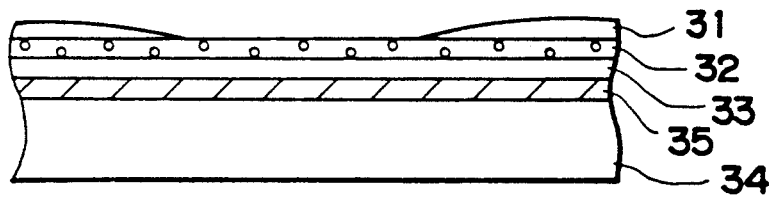
Figure 3F:
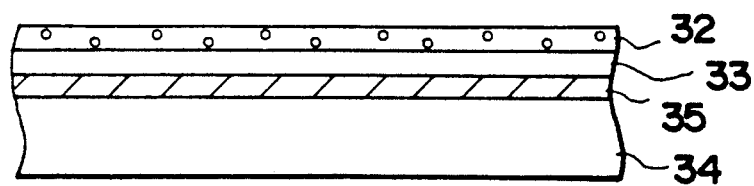

Then, the Si monocrystalline substrate 31 was removed by grinding and polishing to a depth just before the porous Si layer was partially exposed (FIG. 3E) and the monocrystalline Si substrate 31 was removed by etching while using the porous Si layer 32 as an etch-stop layer (FIG. 3F).

The first selective etching was carried out with an etching solution of fluoro-nitric acid system or ethylenediamine+pyrocatechol+water, or KOH system or the like, which had a higher etching rate on Si than on $SiO_2$.

Furthermore, only porous Si layer 32 was subjected to electroless, wet, chemical etching with at least one of the above-mentioned 8 kinds of selective etching solutions on the porous Si to retain and form the monocrystalline Si layer 33 in a thin film state on the insulating substrate 35+34.

Figure 3G:
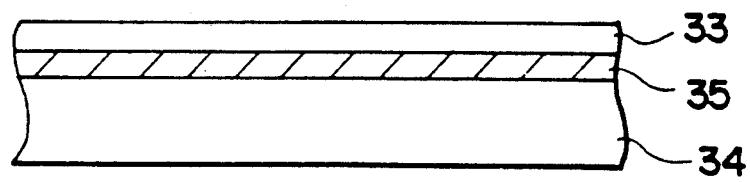

FIG. 3G shows a semiconductor device substrate obtained according to the present invention, where the monocrystalline Si layer 33 was formed as a flat, uniform thin film on the insulating substrate 35+34 throughout the wafer in a large area. The thus obtained semiconductor device substrate could be suitably used even from the viewpoint of preparing dielectrically isolated electronic devices.

EMBODIMENT 4

Figure 12A:
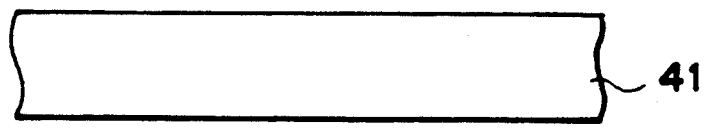
FIGS. 12A to 12G are schematic cross-sectional views explaining one example of the process of the present invention using a light-transmissive substrate.
Figure 12B:
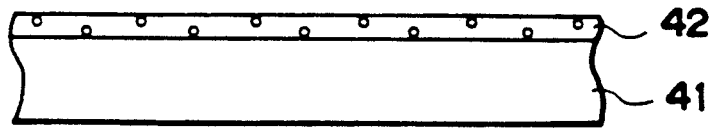
Figure 12C:
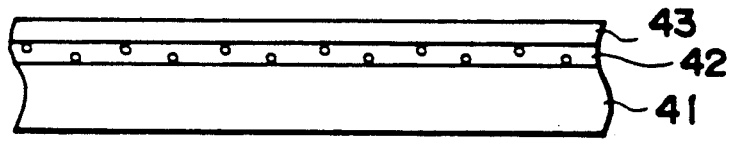
Figure 12D:
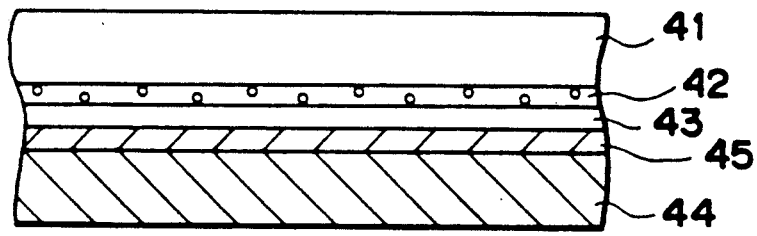

As shown in FIG. 12A a Si monocrystalline substrate 41 was used, and as shown in FIG. 12B its surface layer was made porous and an oxide film was formed on the inside walls of pores in the porous Si layer 42. Furthermore, a monocrystalline Si layer 43 was formed on the porous Si layer 42 (FIG. 12C). As shown in FIG. 12D, a light-transmissive supporting substrate 44 was brought in tight contact with the monocrystalline Si layer 43 through an insulating layer 45 at room temperature and bonded thereto by anodic bonding, compression or heat treatment or a combination thereof, whereby the light-transmissive supporting substrate 44 and the monocrystalline layer 43 could be strongly bonded to each other through the insulating layer 45. The insulating layer 45 was formed on at least one of the monocrystalline Si layer and the light-transmissive supporting substrate 44.

Figure 12E:
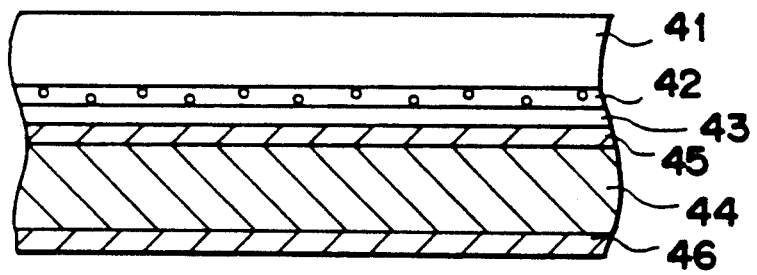
Figure 12F:
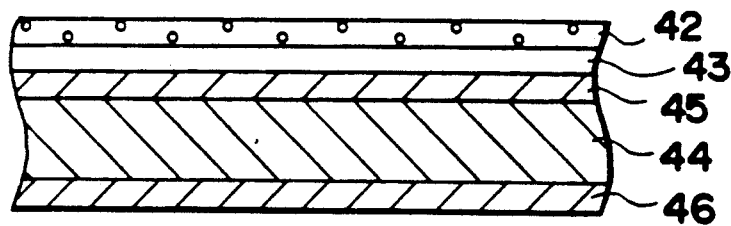

Then, only the surface of the light-transmissive supporting substrate of the bonded substrates was covered with an etching-resistant mask 46 (FIG. 12E), and the monocrystalline Si substrate 41 was removed by etching while using the porous Si layer 42 as an etch-stop layer (FIG. 12F).

The first selective etching was carried out with an etching solution of fluoro-nitric acid system or ethylenediamine+pyrocatechol+water, or KOH system or the like, which has a higher etching rate on Si than on $SiO_2$.

Furthermore, only porous Si layer 42 was subjected to electroless, wet, chemical etching with at least one of the above-mentioned 8 kinds of selective etching solutions on the porous Si to retain, and form the monocrystalline Si layer 43 in a thin film state on the insulating substrate 45+44.

Figure 12G:
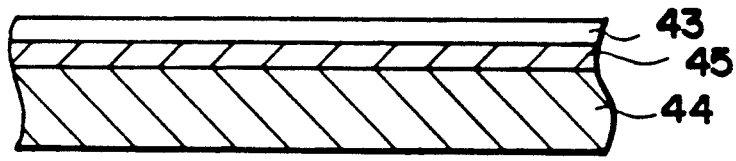
Figure 13A:
FIGS. 13A to 13G are schematic cross-sectional views explaining one example of the process of the present invention.
Figure 13B:
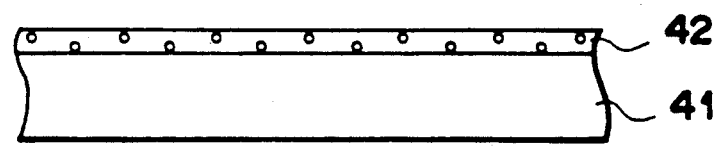
Figure 13C:
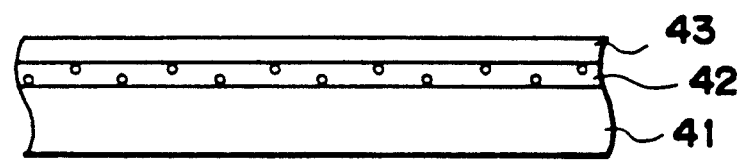
Figure 13D:
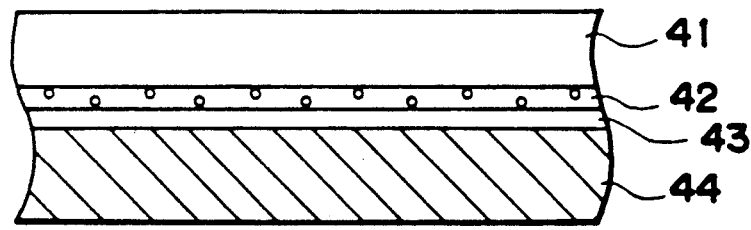
Figure 13E:
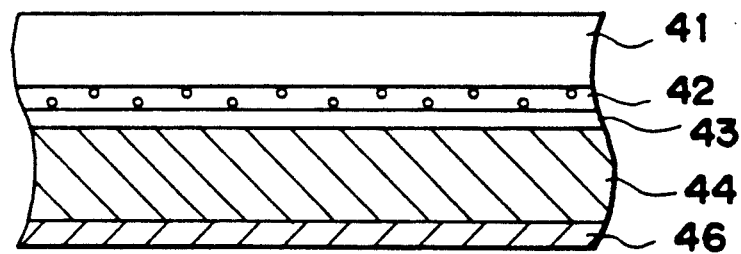
Figure 13F:
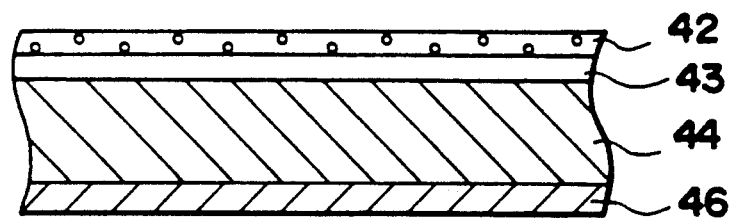
Figure 13G:
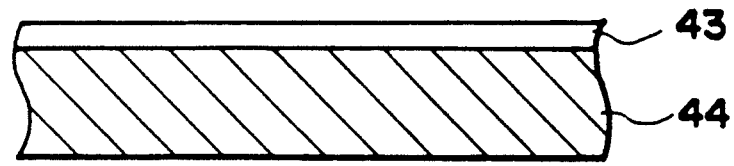

FIG. 12G shows a semiconductor device substrate obtained according to the present invention after removing the mask, where the monocrystalline Si layer 43 was formed as a flat, uniform thin film on the insulating substrate 45+44 throughout the wafer in a large area. When the bonding strength was unsatisfactory, the strength was increased by repeating the bonding in the same manner as in the bonding step. The thus obtained semiconductor device substrate could be suitably used even from the viewpoint of preparing dielectrically isolated electronic devices.

Process steps without the insulating layer 45 in this embodiment are shown in FIGS. 13A to 13G.

EMBODIMENT 5

Figure 14A:
FIGS. 14A to 14H are schematic cross-sectional views explaining one example of the process of the present invention.
Figure 14B:
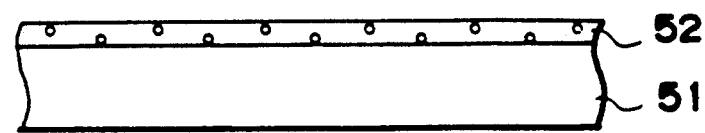
Figure 14C:
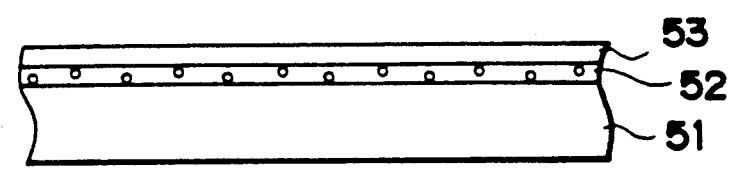
Figure 14D:
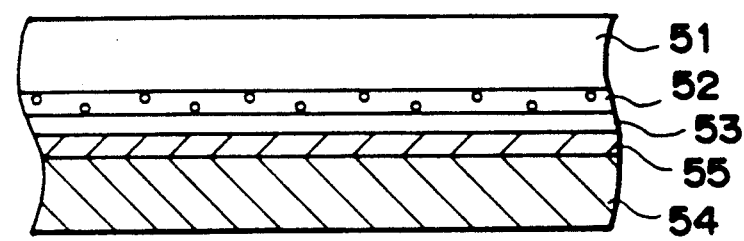

As shown in FIG. 14A a Si monocrystalline substrate 51 was used, and as shown in FIG. 14B its surface layer was made porous and an oxide film was formed on the inside walls of pores in the porous Si layer 52. Furthermore, a monocrystalline Si layer 53 was formed on the porous Si layer 52 (FIG. 14C). As shown in FIG. 14D, a light-transmissive supporting substrate 54 was brought in tight contact with the monocrystalline Si layer 53 through an insulating layer 55 at room temperature and bonded thereto by anodic bonding, compression or heat treatment or a combination thereof, whereby the light-transmissive supporting substrate 54 and the monocrystalline Si layer 53 could be strongly bonded to each other through the insulating layer 55. The insulating layer 55 was formed on at least one of the monocrystalline Si layer and the light-transmissive supporting substrate 54.

Figure 14E:
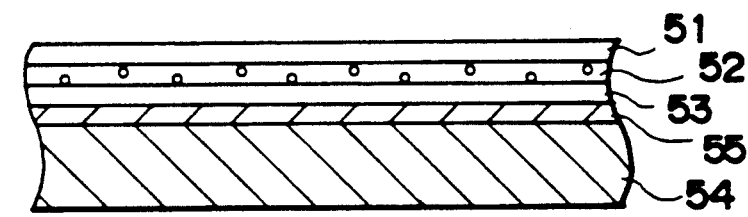
Figure 14F:
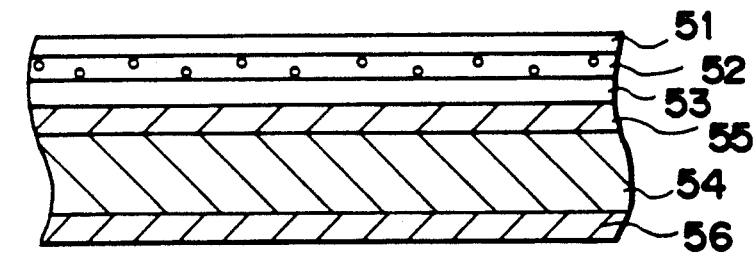
Figure 14G:
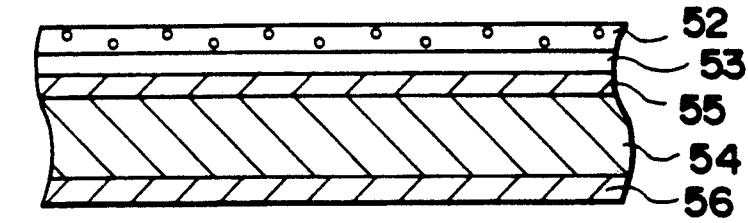

Then, the Si monocrystalline substrate 51 was removed by grinding and polishing to a depth just before the porous Si layer was exposed (FIG. 14E), and only the surface of the light-transmissive supporting substrate of bonded substrates was coated with an etching-resistant mask 56 (FIG. 14F) and the monocrystalline Si substrate 51 was removed by etching while using the remaining porous Si layer 52 as an etch-stop layer (FIG. 14G).

The first selective etching was carried out with an etching solution of fluoro-nitric acid system or ethylenediamine+pyrocatechol+water, or KOH system or the like, which has a higher etching rate on Si than on $SiO_2$.

Furthermore, only porous Si layer 52 was subjected to electroless, wet, chemical etching with at least one of the above-mentioned 8 kinds of selective etching solutions on the porous Si to retain and form, the monocrystalline Si layer 53 in a thin film state on the insulating substrate 53+54.

Figure 14H:
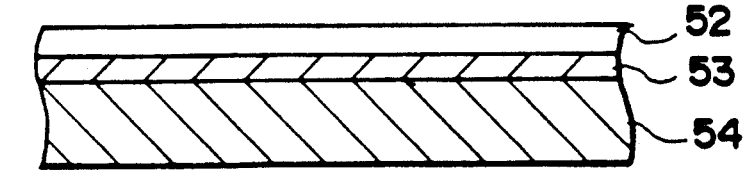
Figure 15A:
FIGS. 15A to 15H are schematic cross-sectional views explaining one example of the process of the present invention.
Figure 15B:
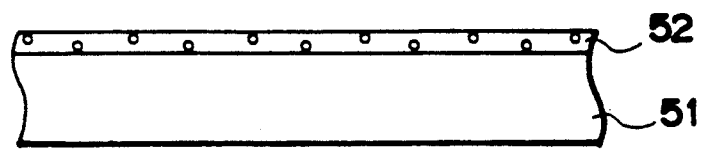
Figure 15C:
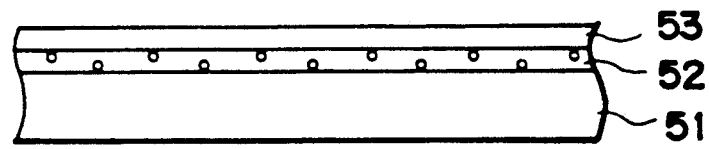
Figure 15D:
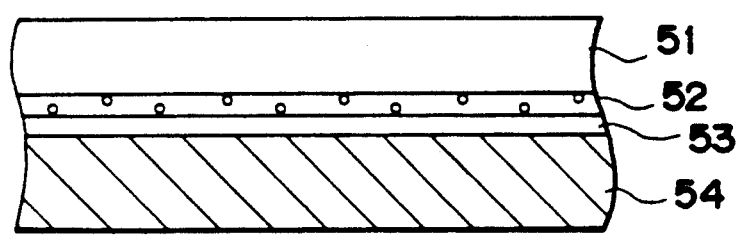
Figure 15E:
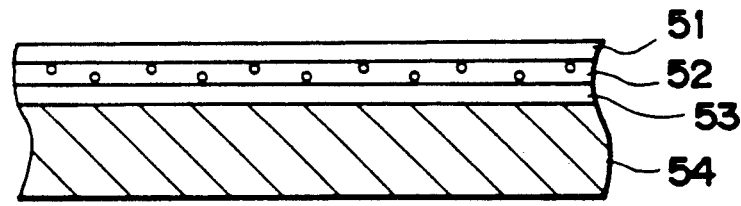
Figure 15F:
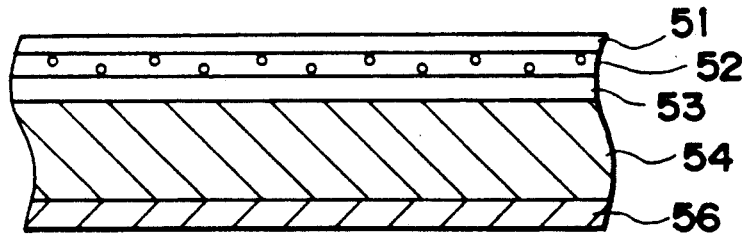
Figure 15G:
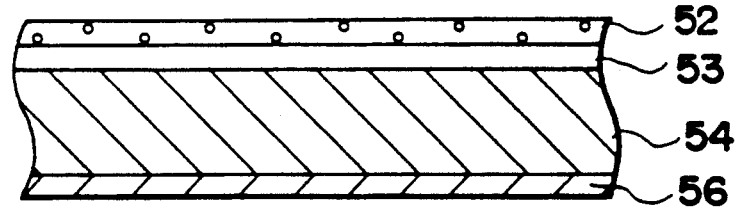
Figure 15H:
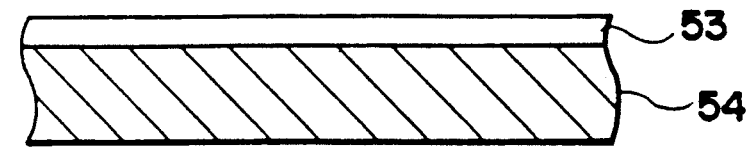

FIG. 14H shows a semiconductor device substrate obtained according to the present invention after removing the etching-resistant mask, where the monocrystalline Si layer 53 was formed as a flat, uniform thin film on the insulating substrate 55+54 throughout the wafer in a large area. When the bonding strength was unsatisfactory, the strength was increased by repeating the bonding in the same manner as in the bonding step. The thus obtained semiconductor device substrate could be suitably used even from the viewpoint of preparing dielectrically isolated electronic devices.

Process steps without the insulating layer 55 in this embodiment are shown in FIGS. 15A to 15H.

EMBODIMENT 6

Figure 16A:
FIGS. 16A to 16H are schematic cross-sectional views explaining one example of the process of the present invention.
Figure 16B:
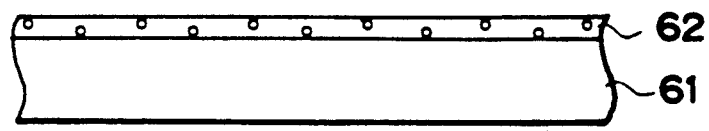
Figure 16C:
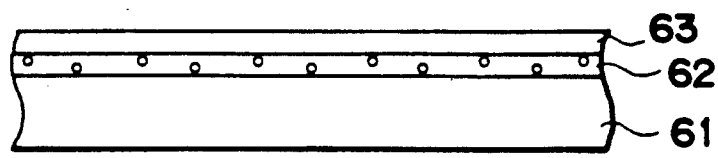
Figure 16D:
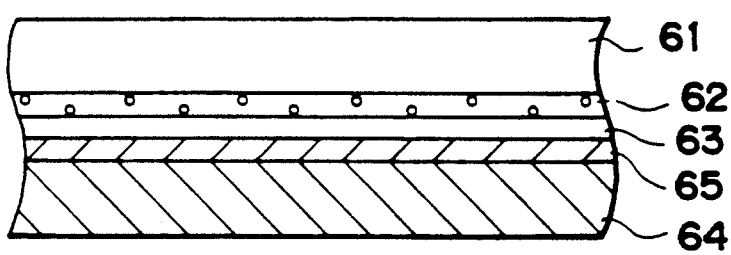

As shown in FIG. 16A, a Si monocrystalline substrate 61 was used, and as shown in FIG. 16B its surface layer was made porous and an oxide film was formed on the inside walls of pores in the porous Si layer 62. Furthermore, a monocrystalline Si layer 63 was formed on the porous Si layer 62 (FIG. 16C). As shown in FIG. 16D, a light-transmissive supporting substrate 64 was brought in tight contact with the monocrystalline Si layer 63 through an insulating layer 65 at room temperature and bonded thereto by anodic bonding, compression or heat treatment or a combination thereof, whereby the Si support substrate 64 and the monocrystalline Si layer 63 could be strongly bonded to each other through the insulating layer 65. The insulating layer 65 was formed on at least one of the monocrystalline Si layer and the Si supporting substrate 64.

Figure 16E:
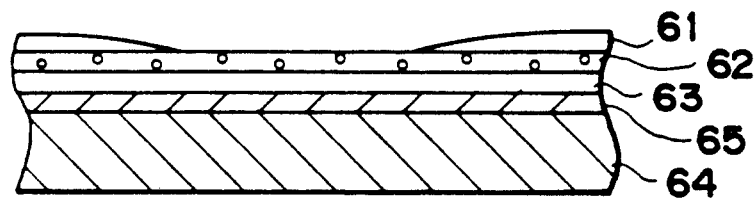
Figure 16F:
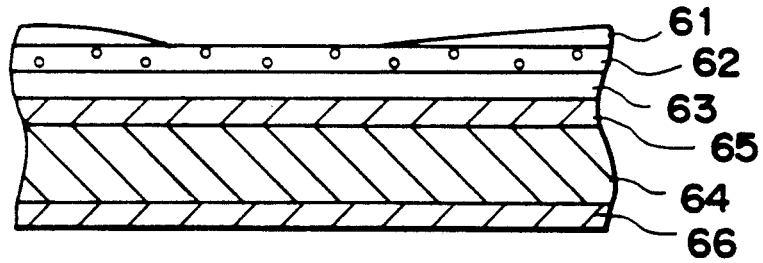
Figure 16G:
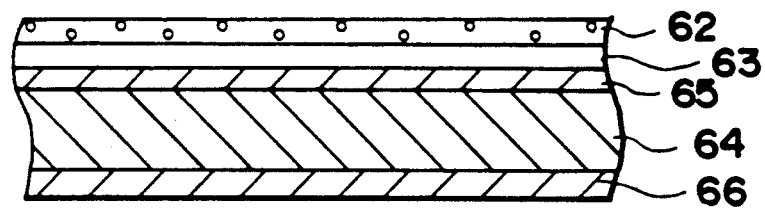

Then, the Si monocrystalline substrate 61 was removed by polishing and granding to a depth that the porous Si layer was partially exposed (FIG. 16E), and only the surface of the light-transmissive supporting substrate of bonded substrates was coated with an etching-resistant mask 66 (FIG. 16F) and the monocrystalline Si substrate 61 was removed by etching while using the porous Si layer 62 as an etch-stop layer (FIG. 16G).

The first selective etching was carried out with an etching solution of fluoro-nitric acid system or ethylenediamine+pyrocatechol+water, or KOH system or the like, which had a higher etching rate on Si than on $SiO_2$.

Furthermore, only porous Si layer 62 was subjected to electroless, wet, chemical etching with at least one of the above-mentioned 8 kinds of selective etching solutions on the porous Si to retain and form the light-transmissive supporting substrate 63 in a thin film state on the insulating substrate 65+64.

Figure 16H:
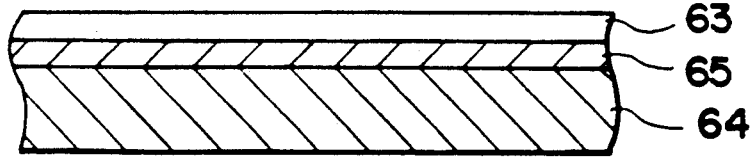
Figure 17A:
FIGS. 17A to 17H are schematic cross-sectional views explaining one example of the process of the present invention.
Figure 17B:
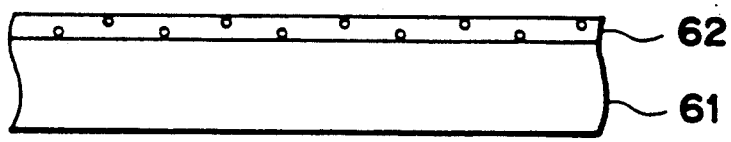
Figure 17C:
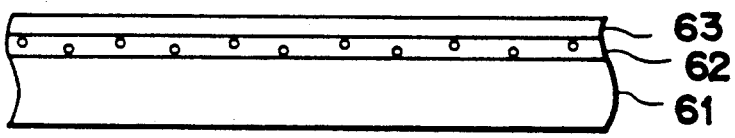
Figure 17D:
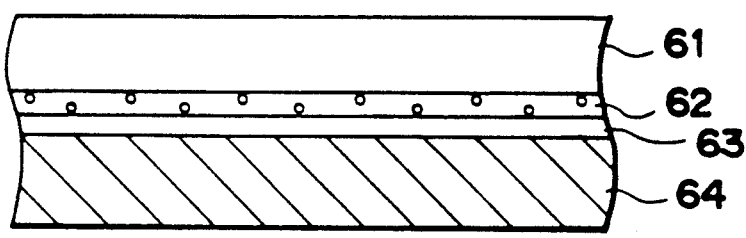
Figure 17E:
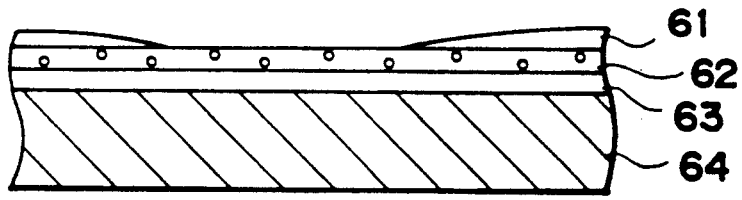
Figure 17F:
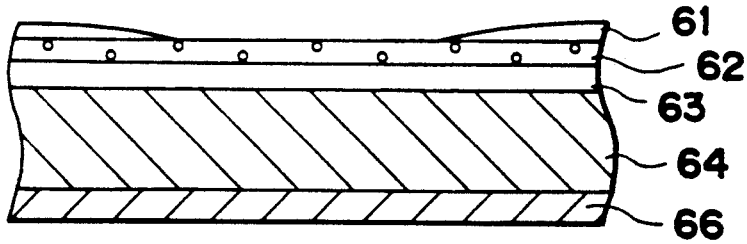
Figure 17G:
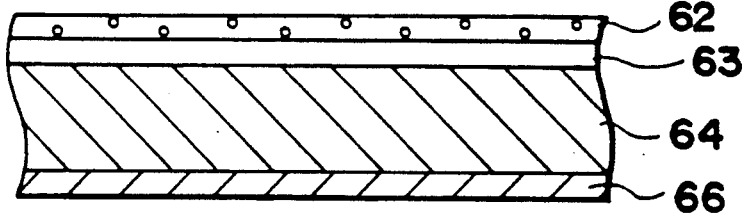
Figure 17H:
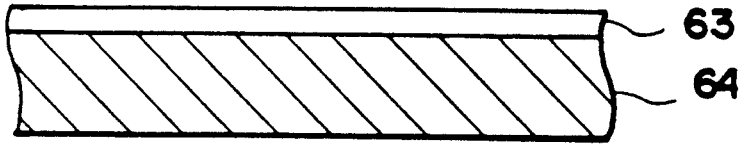

FIG. 16H shows a semiconductor device substrate obtained according to the present invention after removing the etching-resistant mask, where the monocrystalline Si layer 63 was formed as a flat, uniform thin film on the light-transmissive substrate 65+64 throughout the wafer in a large area. When the bonding strength was unsatisfactory, the strength was increased by repeating the bonding in the same manner as in the bonding step. The thus obtained semiconductor device substrate could be suitably used even from the viewpoint of preparing dielectrically isolated electronic devices. Process steps without the insulating layer 65 in this embodiment are shown in FIGS. 17A to 17H.

The present invention will be described below in detail referring to the examples.

EXAMPLE 1

A first p-type or n-type (100) monocrystalline Si substrate having a diameter of 4 inches, a thickness of 525 $\mu m$ and a resistivity of 0.01 $\Omega \cdot cm$ was anodized in an HF solution under the following anodization conditions.
Current density: 5 $mA \cdot cm^{-2}$
Anodizing solution: $HF:H_2O:C_2H_5OH = 1:1:1$
Time: 12 minutes
Thickness of porous Si: 10 $\mu m$
Porosity: 45%

The anodized substrate was oxidized in an oxygen atmosphere at 400° C. for one hour. The inside walls of pores in the porous Si were covered by a thermally oxidized film. Monocrystalline Si was made to epitaxially grow on the porous Si to a thickness of 1 μm by CVD chemical vapor deposition method under the following growth conditions.

Source gas: SiH$_2$Cl$_2$/H$_2$
Gas flow rate: 0.5/180 liter/min.
Gas pressure: 80 Torr
Temperature: 950° C.
Growth rate: 0.3 μm/min.

Furthermore, a SiO$_2$ layer was formed on the surface of the epitaxital Si layer to a thickness of 500 nm by thermal oxidation.

Then, the surface of the SiO$_2$ layer was brought into contact with the surface of a second Si substrate by laying the former onto the latter and heat treated at 1100° C. for 2 hours to bond the former to the latter. These two substrates were strongly bonded to each other by the heat treatment.

Then, only the other surface of the second Si substrate of the bonded substrates was coated with Si$_3$N$_4$ and the first Si substrate was etched in a HNO$_3$+HF (66:34) solution while making the first Si substrate to still have a thickness of 10 μm. Then, the monocrystalline Si substrate having the thickness of 10 μm was selectively etched away in a HF+HNO$_3$+CH$_3$COOH (1:20:20) solution, using the porous Si layer having oxidized inside walls of pores as an etch-stop layer. 10 minutes thereafter, all the first Si substrate was etched and the porous Si layer was exposed.

Then, the porous Si layer was selectively etched in a liquid mixture of 49% hydrofluoric acid, an alcohol and 30% hydrogen peroxide solution (10:6:50) without stirring. 11.4 minutes thereafter, the monocrystalline Si was left without etching, and the porous Si substrate was selectively etched and completely removed, using the monocrystalline Si as an etch-stop material.

Etching rate of nonporous Si monocrystal in the etching solution was very low, for example, not more than 50 Å even after 11.4 minutes, and selectivity to the etching rate of porous Si layer reached 10$^5$ or more. The etching rate of the nonporous layer (decrease in the film thickness was several tens Å) could be practically disregarded.

That is, after removal of the Si$_3$N$_4$ layer from the back side, a monocrystalline Si layer having a thickness of 1 μm could be left on the insulating substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 2

A first p-type or n-type (100) monocrystalline Si substrate having a diameter of 5 inches, a thickness of 625 μm and a resistivity of 0.01 Ω·cm was anodized in an HF solution under the following anodization conditions.

Current density: 10 mA·cm$^{-2}$
Anodizing solution: HF:H$_2$O:C$_2$H$_5$OH=1:1:1
Time: 12 minutes
Thickness of porous Si: 20 μm
Porosity: 47%

The anodized substrate was oxidized in an oxygen atmosphere at 400° C. for 2 hour. The inside walls of pores in the porous Si were covered by a thermally oxidized film. Monocrystalline Si was made to epitaxially grow on the porous Si to a thickness of 0.5 μm by MBE (molecular beam epitaxy) under the following growth conditions.

Temperature: 700° C.
Pressure: 1×10$^{-9}$ Torr
Growth rate: 0.1 μm/min.

Furthermore, a SiO$_2$ layer was formed on the surface of the epitaxial Si layer to a thickness of 500 nm by thermal oxidation.

Then, the surface of the SiO$_2$ layer was brought into contact with the surface of a second Si substrate by laying the former onto the latter and heat treated at 800° C. for 2 hours to bond the former to the latter. These two substrates were strongly bonded to each other by the heat treatment.

Then, only the other surface of the second Si substrate of the bonded substrates was coated with SiO$_2$ and the first Si substrate was etched in ethylenediamine+pyrocatechol+water (17 ml: 3 g:8 ml) at 110° C. while making the first Si substrate to still have a thickness of 10 μm. Then, the monocrystalline Si substrate having the thickness of 10 μm was selectively etched away in a HF+HNO$_3$+CH$_3$COOH (1:40:40) solution, using the porous Si layer having oxidized inside walls of pores as an etch-stop layer. 20 minutes thereafter, all the first Si substrate was etched away and the porous Si layer was exposed.

Then, the porous Si layer was selectively etched in a liquid mixture of 49% hydrofluoric acid and 30% hydrogen peroxide solution (1:5) with stirring. 16.1 minutes thereafter, the monocrystalline Si was left without etching, and the porous Si substrate was selectively etched away and completely removed, using the monocrystalline Si as an etch-stop material.

The etching rate of nonporous Si monocrystal in the etching solution was very low, for example, not more than 50 Å even after 16.1 minutes, and selectivity to the etching rate of porous Si layer reached 10$^5$ or more. The etching rate of the nonporous layer (the decrease in the film thickness was several tens Å) could be practically disregarded.

That is, after removal of the SiO$_2$ layer from the back side, a monocrystalline Si layer having a thickness of 0.5 μm could be left on the insulating substrate. Even by the selective etching of the porous Si, the monocrystalline Si layer was not changed at all.

Cross-sectional observation by a transmission electron microscope revealed that no vew crystal defects were introduced into the Si layer and a good crystallinity was maintained.

EXAMPLE 3

A first n-type (100) monocrystalline Si substrate having a diameter of 6 inches, a thickness of 625 μm and a resistivity of 0.01 Ω·cm was anodized in an HF solution under the following anodization conditions.

Current density: 5 mA·cm$^{-2}$
Anodizing solution: HF:H$_2$O:C$_2$H$_5$OH=1:1:1
Time: 24 minutes
Thickness of porous Si: 20 μm
Porosity: 45%

The anodized substrate was oxidized in an oxygen atmosphere at 400° C. for 2 hour. The inside walls of pores in the porous Si were covered by a thermally oxidized film. Monocrystalline Si was made to epitaxially grow on the porous Si to a thickness of 0.3 μm by bias sputtering method under the following growth conditions.

RF frequency: 100 MHz

High frequency power: 600 W
Temperature: 300° C.
Ar gas pressure: $8 \times 10^{-3}$ Torr
Growth time: 30 min.
Target DC bias: −200 V
Substrate DC bias: +5 V Furthermore, a $SiO_2$ layer was formed on the surface of the epitaxial Si layer to a thickness of 500 nm by thermal oxidation.

Then, the surface of the $SiO_2$ layer was brought into contact with the surface of $SiO_2$ layer of a second Si substrate on which a thermal oxide film was separately formed by laying the former onto the latter, strongly attached thereto by anodic bonding at room temperature and heat treated at 1100° C. for 2 hours to bond the former to the latter.

Then, only the other surface of the second Si substrate of the bonded substrates was coated with $Si_3N_4$ and the first Si substrate was etched in a $HNO_3 + HF$ (66:34) solution while making the first Si substrate to still have a thickness of 10 μm. Then, the monocrystalline Si substrate having the thickness of 10 μm was selectively etched away in 6 M KOH, using the porous Si layer having oxidized inside walls of pores as an etch-stop layer. 10 minutes thereafter, all the first Si substrate was etched away and the porous Si layer was exposed.

Then, the porous Si layer was selectively etched in a liquid mixture of 49% hydrofluoric acid and an alcohol (10:1) without stirring. 19.3 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, not more than 50 Å even after 19.3 minutes, and selectivity to the etching rate of porous Si layer reached $10^5$ or more. The etching rate of the nonporous layer (the decrease in the film thickness was several tens Å) could be practically disregarded.

That is, after removal of the $Si_3N_4$ layer from the back side, a monocrystalline Si layer having a thickness of 0.3 μm could be left on the insulating substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 4

A first p-type or n-type (100) monocrystalline Si substrate having a diameter of 4 inches, a thickness of 525 μm and a resistivity of 0.01 Ω·cm was anodized in an HF solution under the following anodization conditions.
Current density: 5 mA·cm$^{-2}$
Anodizing solution: $HF:H_2O:C_2H_5OH = 1:1:1$
Time: 24 minutes
Thickness of porous Si: 20 μm
Porosity: 45%

The anodized substrate was oxidized in an oxygen atmosphere at 400° C. for 2 hour. The inside walls of pores in the porous Si were covered by a thermally oxidized film. Monocrystalline Si was made to epitaxially grow on the porous Si to a thickness of 5 μm by liquid phase growth method under the following rowth conditions.
Solvent: Sn
Growth temperature: 900° C.
Growth atmosphere: $H_2$
Growth time: 50 min.

Then, the surface of the Si layer was brought into contact with the surface of $SiO_2$ layer of a second Si substrate having a thermally oxidized film with a thickness of 500 nm by laying the former onto the latter, subjected to anodic bonding at 800° C., and heat treated at 1100° C. for two hours to bond the former to the latter. These two substrates were strongly bonded to each other by the heat treatment.

Then, the first Si substrate was removed by grinding and polishing to the remaining thickness of 10 μm, and then the remaining monocrystalline Si substrate having a thickness of 10 μm was selectively etched away in an $HF + HNO_3 + CH_3COOH$ (1:20:20) solution, using the porous Si layer having oxidized inside walls in the pores as an etch stop layer. 10 minutes thereafter, all the first Si substrate was etched and the porous Si layer was exposed.

Then, the porous Si layer was selectively etched in 49% hydrofluoric acid with stirring. 18.6 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, not more than 50 Å even after 18.6 minutes, and selectivity to the etching rate of porous Si layer reached $10^5$ or more. The etching rate of the nonporous layer (the decrease in the film thickness was several 10 Å) could be practically disregarded.

A monocrystalline Si layer having a thickness of 5 μm could be left on the insulating substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 5

A first p-type or n-type (100) monocrystalline Si substrate having a diameter of 5 inches, a thickness of 625 μm and a resistivity of 0.01 Ω·cm was anodized in an HF solution under the following anodization conditions.
Current density: 5 mA·cm$^{-2}$
Anodizing solution: $HF:H_2O:C_2H_5OH = 1:1:1$
Time 12 minutes
Thickness of porous Si: 10 μm
Porosity: 45%

The anodized substrate was oxidized in an oxygen atmosphere at 400° C. for one hour. The inside walls of pores in the porous Si were covered by a thermally oxidized film. Monocrystalline Si was made to epitaxially grow on the porous Si to a thickness of 0.3 μm by CVD method under the following growth conditions.
Source gas: $SiH_4$
Carrier gas: $H_2$
Pressure: $1 \times 10^{-2}$ Torr
Temperature: 850° C.
Growth rate: 3.3 nm/sec.

Furthermore, a SiO$_2$ layer was formed on the surface of the epitaxial Si layer to a thickness of 500 nm by thermal oxidation.

Then, the surface of the SiO$_2$ layer was brought into contact with an Si$_3$N$_4$ film surface of a second Si substrate having the Si$_3$N$_4$ film having a thickness of 200 nm thereon by laying the former onto the Si$_3$N$_4$ film surface of the latter and bonded to each other by anodic bonding at 800° C. These two substrates were strongly bonded to each other by the heat treatment.

Then, the first Si substrate was removed by grinding and polishing, while making the first Si substrate to have a remaining thickness of 5 μm, and then the monocrystalline Si substrate having the remaining thickness of 5 μm was selectively etched away in a HF+HNO$_3$+CH$_3$COOH (1:10:10) solution, using the porous Si layer having oxidized inside walls of pores as an etch-stop layer. 10 minutes thereafter, all the first Si substrate was etched and the porous Si layer was exposed.

Then, the porous Si layer was selectively etched in a liquid mixture of buffered hydrofluoric acid (36% NH$_4$F+4.5% HF+H$_2$O), an alcohol and 30% hydrogen peroxide solution (10:6:50) without stirring. One minute thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, not more than 50 Å even after one minute, and selectivity to the etching rate of porous Si layer reached 10$^5$ or more. The etching rate of the nonporous layer (the decrease in the film thickness was several 10 Å) could be practically disregarded.

A monocrystalline Si layer having a thickness of 0.3 μm could be left on the insulating substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 6

A first p-type or n-type (100) monocrystalline Si substrate having a diameter of 6 inches, a thickness of 625 μm and a resistivity of 0.01 Ω·cm was anodized in an HF solution under the following anodization conditions.

Current density: 5 mA·cm$^{-2}$
Anodizing solution: HF:H$_2$O:C$_2$H$_5$OH=1:1:1
Time: 12 minutes
Thickness of porous Si: 10 μm
Porosity: 45%

The anodized substrate was oxidized in an oxygen atmosphere at 400° C. for one hour. The inside walls of pores in the porous Si were covered by a thermally oxidized film. Monocrystalline Si was made to epitaxially grow on the porous Si to a thickness of 0.2 μm by CVD method under the following growth conditions.

Source gas: SiH$_4$
Carrier gas: H$_2$
Pressure: 1×10$^{-2}$ Torr
Temperature: 850° C.
Growth rate: 3.3 nm/sec.

Furthermore, a SiO$_2$ layer was formed on the surface of the epitaxial Si layer to a thickness of 500 nm by thermal oxidation.

Then, the surface of the SiO$_2$ layer was brought into contact with the surface of a second Si substrate by laying the former onto the latter and heat treated at 1100° C. for 2 hours to bond the former to the latter. There two substrates were strongly bonded to each other by the heat treatment.

Then, the first Si substrate was removed by grinding and polishing until the porous Si was partially exposed, and then the remaining monocrystalline Si substrate was selectively etched away in an HF+HNO$_3$+CH$_3$COOH (1:40:40) solution, using the porous Si layer having oxidized inside walls of pores as an etch-stop layer. 3 minutes thereafter, all the first Si substrate was entirely etched and the porous Si layer was exposed in the whole region.

Then, the porous Si layer was selectively etched in a liquid mixture of buffered hydrofluoric acid (36% NH$_4$F+4.5% HF+H$_2$O) and 30% hydrogen peroxide solution (1:5) with stirring. One minute thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, not more than 50 Å even after one minute, and selectivity to the etching rate of porous Si layer reached 10$^5$ or more. The etching rate of the nonporous layer (the decrease in the film thickness was several tens Å) could be practically disregarded.

That is, a monocrystalline Si layer having a thickness of 0.2 μm could be left on the insulating substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 7

A first p-type or n-type (100) monocrystalline Si substrate having a diameter of 6 inches, a thickness of 625 μm and a resistivity of 0.01 Ω·cm was anodized in an HF solution under the following anodization conditions.

Current density: 5 mA·cm$^{-2}$
Anodizing solution HF:H$_2$O:C$_2$H$_5$OH=1:1:1
Time 12 minutes
Thickness of porous Si: 10 μm
Porosity: 45%

The anodized substrate was oxidized in an oxygen atmosphere at 400° C. for one hour. The inside walls of pores in the porous Si were covered by a thermally oxidized film. Monocrystalline Si was made to epitaxially grow on the porous Si to a thickness of 0.3 μm by CVD method under the following growth conditions.

Source gas: SiH$_2$Cl$_2$/H$_2$
Gas flow rate: 0.5/180 liter/min.
Gas pressure: 80 Torr
Temperature: 950° C.
Growth rate: 0.3 μm/min.

Then, the surface of the SiO$_2$ layer was brought into contact with the surface of a second Si substrate by laying the former onto the latter through a glass substrate having a thickness of 100 μm and flatted surfaces at both sides and heat treated at 900° C. for 2 hours to bond the former to the latter. These three substrates were strongly bonded to one another by the heat treatment.

Then, the first Si substrate was removed by grinding and polishing, while making the first Si substrate to have a remaining thickness of 5 μm, and then the remaining monocrystalline Si substrate was selectively etched away in an aqueous KOH solution at 110° C., using the porous Si layer having oxidized inside walls of pores as an etch-stop layer. One minute thereafter, all the first Si substrate was entirely etched away and the porous Si layer was exposed in the whole region.

Then, the porous Si layer was selectively etched in a liquid mixture of buffered hydrofluoric acid (36% $NH_4F$ + 4.5% HF + $H_2O$) alcohol solution (10:1) without stirring. 1.4 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, not more than 50 Å after 1.4 minutes, and selectivity to the etching rate of porous Si layer reached $10^5$ or more. The etching rate of the nonporous layer (the decrease in the film thickness was several tens Å) could be practically disregarded.

That is, a monocrystalline Si layer having a thickness of 0.3 μm could be left on the insulating substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 8

An n-type (100) monocrystalline Si substrate having a diameter of 6 inches, a thickness of 625 μm and a resistivity of 0.01 Ω·cm was anodized in an HF solution under the following anodization conditions.
Current density: 5 mA·cm$^{-2}$
Anodizing solution: $HF:H_2O:C_2H_5OH$ = 1:1:1
Time: 12 minutes
Thickness of porous Si: 10 μm
Porosity: 45%

The anodized substrate was oxidized in an oxygen atmosphere at 400° C. for one hour. The inside walls of pores in the porous Si were covered by a thermally oxidized film. Monocrystalline Si was made to epitaxially grow on the porous Si to a thickness of 0.3 μm by CVD method under the following growth conditions.
Source gas: $SiH_2Cl_2/H_2$
Gas flow rate: 0.5/180 liter/min.
Gas pressure: 80 Torr
Temperature: 950° C.
Growth rate: 0.3 μm/min.

Furthermore, a $SiO_2$ layer was formed on the surface of the epitaxial Si layer to a thickness of 500 nm by thermal oxidation.

Then, the surface of the $SiO_2$ layer was brought into contact with the surface of a second Si substrate by laying the former through a fused quartz substrate having a thickness of 50 μm and flatted onto the latter surfaces at both sides and bonded to one another at 400° C. by anodic bonding to bond the former to the latter. These three substrates were strongly bonded to each other by the heat treatment.

Then, the first Si substrate was removed by grinding and polishing, while making the first Si substrate to have a thickness of 5 μm, and then the remaining monocrystalline Si substrate was selectively etched away in a solution of ethylenediamine + pyrocatechol + water (17 ml: 3 g: 8 ml) at 110° C., using the porous Si layer having oxidized inside walls of pores as an etch-stop layer. 3 minutes thereafter, all the first Si substrate was entirely etched and the porous Si layer was exposed in the whole region.

Then, the porous Si layer was selectively etched in buffered hydrofluoric acid (36% $NH_4F$ + 4.5% HF + $H_2O$) with stirring. 1.3 minutes thereafter, the monocrystalline Si was lest without etching, and the porous Si substrate was selectively etched and completely removed, using the monocrystalline Si as an etch-stop material.

The etching rate of nonporous Si monocrystal in the etching solution was very low, for example, not more than 50 Å even after 1.3 minutes, and selectivity to the etching rate of porous Si layer reached $10^5$ or more. The etching rate of the nonporous layer (the decrease in the film thickness was several tens Å) could be practically disregarded.

That is, a monocrystalline Si layer having a thickness of 0.3 μm could be left on the insulating substrate. Even by the selective etching of the porous Si, the monocrystalline Si layer was not changed at all.

Cross-sectional observation by a transmission electron microscope revealed that no new crystal defects were introduced into the Si layer and a good crystalline was maintained.

EXAMPLE 9

A first p-type (100) monocrystalline Si substrate having a diameter of 6 inches, a thickness of 625 μm and a resistivity of 0.01 Ω·cm was anodized in an HF solution under the following anodization conditions.
Current density: 5 mA·cm$^{-2}$
Anodizing solution: $HF:H_2O:C_2H_5OH$ = 1:1:1
Time: 12 minutes
Thickness of porous Si: 10 μm
Porosity: 45%

Porous Si was readily oxidized in the atmosphere. By RCA washing before epitaxial growth, oxidation of pore insides was promoted. The inside walls of pores in the porous Si were covered by an oxide film. Monocrystalline Si was made to epitaxially grow on the porous Si to a thickness of 0.2 μm by CVD method under the following growth conditions.
Source gas: $SiH_4$
Carrier gas: $H_2$
Gas flow rate: 0.5/180 liter/min.
Pressure: $1 \times 10^{-2}$ Torr
Temperature: 850° C.
Growth rate 3.3 nm/sec.

Furthermore, a $SiO_2$ layer was formed on the surface of the epitaxial Si layer to a thickness of 500 nm by thermal oxidation.

Then, the surface of the $SiO_2$ layer was brought into contact with the surface of a second Si substrate by laying the former onto the latter and heat treated at 1100° C. for 2 hours to bond the former to the latter. There two substrates were strongly bonded to each other by the heat treatment.

Then, the first Si substrate was removed by grinding and polishing, while making the first Si substrate to have a thickness of 5 μm, and then the remaining monocrystalline Si substrate was selectively etched away in a solution of HF+HNO$_3$+CH$_3$COOH (1:40:40), using the porous Si layer having oxidized inside walls of pores as an etch-stop layer. 10 minutes thereafter, all the first Si substrate was entirely etched and the porous Si layer was exposed in the whole region.

Then, the porous Si layer was selectively etched in a liquid mixture of 49% hydrofluoric acid and 30% hydrogen peroxide solution (1:5) with stirring. 16.1 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, not more than 50 Å even after 16.1 minutes, and selectivity to the etching rate of porous Si layer reached $10^5$ or more. The etching rate of the nonporous layer (the decrease in the film thickness was several tens Å) could be practically disregarded.

That is, after removal of the Si$_3$N$_4$ layer from the back side, a monocrystalline Si layer having a thickness of 0.2 μm could be left on the insulating substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 10

A first p-type or n-type (100) monocrystalline Si substrate having a diameter of 4 inches, a thickness of 525 μm and a resistivity of 0.01 Ω·cm was anodized in an HF solution under the following anodization conditions.
Current density: 5 mA·cm$^{-2}$
Anodizing solution: HF:H$_2$O:C$_2$H$_5$OH=1:1:1
Time: 12 minutes
Thickness of porous Si: 10 μm
Porosity: 45%

The anodized substrate was oxidized in an oxygen atmosphere at 400° C. for one hour. The inside walls of pores in the porous Si were covered by a thermally oxidized film. Monocrystalline Si was made to epitaxially grow on the porous Si to a thickness of 1 μm by CVD method under the following growth conditions.
Source gas: SiH$_2$Cl$_2$/H$_2$
Gas flow rate: 0.5/180 liter/min.
Gas pressure 80 Torr
Temperature: 950° C.
Growth rate: 0.3 μm/min.

Furthermore, a SiO$_2$ layer was formed on the surface of the epitaxial Si layer to a thickness of 500 nm by thermal oxidation.

Then, the surface of the SiO$_2$ layer was brought into contact with the surface of a second Si substrate by laying the former onto the latter and heat treated at 1100° C. for 2 hours to bond the former to the latter. These two substrates were strongly bonded to each other by the heat treatment.

Then, only the other surface of the fused quartz substrate of the bonded substrates was coated with Si$_3$N$_4$ and the first Si substrate was etched in a HNO$_3$+HF (66:34) solution while making the first Si substrate to still have a thickness of 10 μm.

Then, the monocrystalline Si substrate having the thickness of 10 μm was selectively etched away in a HF+HNO$_3$+CH$_3$COOH (1:20:20) solution, using the porous Si layer having oxidized inside walls of pores as an etch-stop layer. 10 minutes thereafter, all the first Si substrate was entirely etched and the porous Si layer was exposed.

Then, the porous Si layer was selectively etched in a liquid mixture of 49% hydrofluoric acid, an alcohol and 30% hydrogen peroxide solution (10:6:50) without stirring. 11.4 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, not more than 50 Å even after 11.4 minutes, and selectivity to the etching rate of porous Si layer reached $10^5$ or more. The etching rate of the nonporous layer (the decrease in the film thickness was several tens Å) could be practically disregarded.

After removal of the etching mask from the back side, the bonded substrates were heat-treated at 900° C. for 30 minutes to increase the bonding strength. By the heat treatment both substrates were strongly bonded to each other.

That is, a monocrystalline Si layer having a thickness of 1 μm could be left on the fused quartz substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 11

A first p-type or n-type (100) monocrystalline Si substrate having a diameter of 5 inches, a thickness of 625 μm and a resistivity of 0.01 Ω·cm was anodized in an HF solution under the following anodization conditions.
Current density: 10 mA·cm$^{-2}$
Anodizing solution: HF:H$_2$O:C$_2$H$_5$OH=1:1:1
Time: 12 minutes
Thickness of porous Si: 20 μm
Porosity: 47%

The anodized substrate was oxidized in an oxygen atmosphere at 400° C. for 2 hours. The inside walls of pores in the porous Si were covered by a thermally oxidized film through the oxidation. Monocrystalline Si was made to epitaxially grow on the porous Si to a thickness of 0.5 μm by MBE (molecular beam epitaxy) method under the following growth conditions.
Temperature: 700° C.
Pressure: $1 \times 10^{-9}$ Torr
Growth rate: 0.1 m/sec.

Furthermore, a SiO$_2$ layer was formed on the surface of the epitaxial Si layer to a thickness of 500 nm by thermal oxidation.

Then, the surface of the SiO2 layer was brought into contact with the surface of a glass substrate having a softening point of 800° C. by laying the former onto the latter and heat treated at 750° C. for 0.5 hours to bond the former to the latter. These two substrates were strongly bonded to each other by the heat treatment.

Then, only the other surface of the glass substrate having a softening point of about 800° C. of the bonded substrates was coated with Si$_3$N$_4$ and further with SiO$_2$, and the first Si substrate was etched away in ethylenediamine+pyrocatechol+water (17 ml:3 g:8 ml) at 110° C., while making the first Si substrate to still have a thickness of 10 μm, and then the monocrystalline Si substrate having the thickness of 10 μm was selectively etched away in a HF+HNO₃+CH₃COOH (1:40:40) solution, using the porous Si layer having oxidized inside walls of pores as an etch-stop layer. 20 minutes thereafter, all the first Si substrate was etched and the porous Si layer was exposed.

Then, the porous Si layer was selectively etched in a liquid mixture of 49% hydrofluoric acid and 30% hydrogen peroxide solution (1:5) with stirring. 16.1 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, not more than 50 Å even after 16.1 minutes, and selectivity to the etching rate of porous Si layer reached $10^5$ or more. The etching rate of the nonporous layer (the decrease in the film thickness was several tens Å) could be practically disregarded.

That is, after removal of the etching mask from the back side, a monocrystalline Si layer having a thickness of 0.5 μm could be left on the glass substrate having a softening point of about 800° C. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 12

A first n-type (100) monocrystalline Si substrate having a diameter of 6 inches a thickness of 625 || m and a resistivity of 0.01 Ω·cm was anodized in an HF solution under the following anodization conditions.
Current density: 5 mA·cm$^{-2}$
Anodizing solution: HF:H₂O:C₂H₅OH=1:1:1
Time: 24 minutes
Thickness of porous Si: 20 μm
Porosity: 45%

The anodized substrate was oxidized in an oxygen atmosphere at 400° C. for 2 hours. The inside walls of pores in the porous Si were covered by a thermally oxidized film. Monocrystalline Si was made to epitaxially grow on the porous Si to a thickness of 0.3 μm by bias sputtering method under the following growth conditions.
RF frequency: 100 MHz
High frequency power: 600 W
Temperature: 300° C.
Ar gas pressure: $8 \times 10^{-3}$ Torr
Growth time: 36 min.
Target DC bias: −200 V
Substrate bias: +5 V Furthermore, a SiO₂ layer was formed on the surface of the epitaxial Si layer to a thickness of 500 nm by thermal oxidation.

Then, the surface of the SiO₂ layer was brought into contact with the surface of a fused quartz substrate by laying the former onto the latter, tightly bonded thereto at room temperature by anodic bonding and heat treated at 400° C. for 2 hours to bond the former to the latter.

Then, only the other surface of the fused glass substrate of the bonded substrates was coated with Si₃N₄ and the first Si substrate was etched, in a HNO₃+HF (66:34) solution while making the first Si substrate to still have a thickenss of 10 μm.

Then, the monocrystalline Si substrate having the thickness of 10 μm was selectively etched away in 6 M KOH, using the porous Si layer having oxidized inside walls of pores as an etch-stop layer. 10 minutes thereafter, all the first Si substrate was etched and the porous Si layer was exposed.

Then, the porous Si layer was selectively etched in a liquid mixture of 49% hydrofluoric acid and an alcohol (10:1) without stirring. 19.3 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, about 50 Å or less even after 19.3 minutes, and selectivity to the etching rate of porous Si layer reached $10^5$ or more. The etching rate of the nonporous layer (the decrease in the film thickness was several tens Å) could be practically disregarded.

That is, after removal of the etching mask from the back side, the substrates were heat treated at 900° C. for 30 minutes to increase the bonding strength. By the heat treatment, these two substrates were strongly bonded to each other.

That is, a monocrystalline Si layer having a thickness of 0.3 μm could be left on the fused quartz substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 13

A first p-type or n-type (100) monocrystalline Si substrate having a diameter of 4 inches, a thickness of 525 μm and a resistivity of 0.01Ω·cm was anodized in an HF solution under the following anodization conditions.
Current density: 5 mA·cm$^{-2}$
Anodizing solution: HF:H₂O:C₂H₅OH=1:1:1
Time: 24 minutes
Thickness of porous Si: 20 μm
Porosity: 45%

The anodized substrate was oxidized in an oxygen atmosphere at 400° C. for 2 hours. The inside walls of pores in the porous Si were covered by a thermally oxidized film. Monocrystalline Si was made to epitaxially grow on the porous Si to a thickness of 5 μm by liquid phase growth method under the following growth conditions.
Solvent: Sn
Growth temperature: 900° C.
Growth atmosphere: H₂
Growth time: 50 min.

Then, the surface of the Si layer was brought into contact with the surface of a glass substrate having a softening point of about 500° C. by laying the former onto the latter and subjected to anodic bonding at 400° C. to bond the former to the latter. These two substrates were strongly bonded to each other by the heat treatment.

Then, the first Si substrate was removed by grinding and polishing white making the first Si substrate to still have a thickness of 10 μm and only the other surface of the glass substrate having a softening point of about 500° C. was coated with $Si_3N_4$, and then the monocrystalline Si substrate having the thickness of 10 μm was selectively etched away in an $HF+HNO_3+CH_3COOH$ (1:20:20) solution, using the porous Si layer having oxidized inside walls of pores as an etch-stop layer. 10 minutes thereafter, all the first Si substrate was etched and the porous Si layer was exposed.

Then, the porous Si layer was selectively etched in 49% hydrofluoric acid with stirring. 18.6 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, about 50 Å or less even after 18.6 minutes, and selectivity to the etching rate of porous Si layer reached $10^5$ or more. The etching rate of the nonporous layer (the decrease in the film thickness was several tens Å) could be practically disregarded.

That is, after removal of the $Si_3N_4$ layer from the back side, a monocrystalline Si layer having a thickness of 5 μm could be left on the glass substrate having a softening point of about 500° C. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 14

A first p-type or n-type (100) monocrystalline Si substrate having a diameter of 5 inches a thickness of 625 μm and a resistivity of 0.01 Ω·cm was anodized in an HF solution under the following anodization conditions.

Current density: 5 mA·cm$^{-2}$
Anodizing solution: $HF:H_2O:C_2H_5OH=1:1:1$
Time: 12 minutes
Thickness of porous Si: 10 μm
Porosity: 45%

The anodized substrate was oxidized in an oxygen atmosphere at 400° C. for one hour. The inside walls of pores in the porous Si were covered by a thermally oxidized film. Monocrystalline Si was made to epitaxially grow on the porous Si to a thickness of 0.3 μm by CVD method under the following growth conditions.
Source gas: $SiH_4$
Carrier gas: $H_2$
Pressure: $1\times 10^{-2}$ Torr
Temperature: 850° C.
Growth rate: 3.3 nm/sec.

Furthermore, an $SiO_2$ layer was formed on the surface of the epitaxial Si layer to a thickness of 500 nm by thermal oxidation.

Then, the surface of the $SiO_2$ layer was brought into contact with the surface an $Si_3N_4$ layer of a glass substrate having a softening point of about 800° C. and having the $Si_3N_4$ film, 200 nm thick by laying the former onto the latter and subjected to anodic bonding at 750° C. to bond the former to the latter. These two substrates were strongly bonded to each other thereby.

Then, the first Si substrate was removed by grinding and polishing while making the first Si substrate to still have a thickness of 5 μm, and only the other surface of the glass substrate having a softening point of about 800° C. of the bonded substrates was coated with $Si_3N_4$ and then the monocrystalline Si substrate having the thickness of 5 μm was selectively etched away in an $HF+HNO_3+CH_3COOH$ (1:10:10) solution, using the porous Si layer having oxidized inside walls of pores as an etch-stop layer. 5 minutes thereafter, all the first Si substrate was etched away and the porous Si layer was exposed.

Then, the porous Si layer was selectively etched in a liquid mixture of buffered hydrofluoric acid (36% $NH_4F+4.5\% HF+H_2O$), an alcohol and 30% hydrogen peroxide solution (10:6:50) without stirring. One minute thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, about 50 Å or less even after one minute, and selectivity to the etching rate of porous Si layer reached $10^5$ or more. The etching rate of the nonporous layer (the decrease in the film thickness was several tens Å) could be practically disregarded.

That is, after removal of the $Si_3N_4$ layer from the back side, a monocrystalline Si layer having a thickness of 0.3 μm could be left on the glass substrate having a softening point of about 800° C. Even by the selective etching of the porous Si, the monocrystalline Si layer was not changed at all.

Cross-sectional observation by a transmission electron microscope revealed that no new crystal defects were introduced into the Si layer and a good crystallinity was maintained

EXAMPLE 15

A first p-type or n-type (100) monocrystalline Si substrate having a diameter of 6 inches, a thickness of 625 μm and a resistivity of 0.01Ω·cm was anodized in an HF solution under the following anodization conditions.
Current density: 5 mA·cm$^{-2}$
Anodizing solution: $HF:H_2O:C_2H_5OH=1:1:1$
Time: 12 minutes
Thickness of porous Si: 10 μm
Porosity 45%

The anodized substrate was oxidized in an oxygen atmosphere at 400° C. for one hour. The inside walls of pores in the porous Si were covered by a thermally oxidized film. Monocrystalline Si was made to epitaxially grow on the porous Si to a thickness of 1 μm by CVD method under the following growth conditions.
Source gas: $SiH_4$
Carrier gas: $H_2$
Gas flow rate: 0.5/180 l/min.
Pressure: $1\times 10^{-2}$ Torr
Temperature: 850° C.
Growth rate: 3.3 nm/sec.

Then, the surface of the Si layer was brought into contact with the surface of a fused quartz substrate by laying the former onto the latter and heat treated at 500° C. for 0.5 hours to bond the former to the latter.

Then, the first Si substrate was removed by grinding and polishing until the porous Si was partially exposed, and then the other surface of the fused quartz substrate of bonded substrates was coated with $Si_3N_4$ and then the remaining monocrystalline Si was selectively etched away in an $HF+HNO_3+CH_3COOH$ (1:40:40) solution, using the porous Si layer having oxidized inside walls of pores as an etch-stop layer. 3 minutes thereafter, all the first Si substrate was etched and the porous Si layer was exposed over a whole area.

Then, the porous Si layer was selectively etched in a liquid mixture of buffered hydrofluoric acid (36% NH$_4$H+4.5% HF+H$_2$O) and 30% hydrogen peroxide solution (1:5) with stirring. One minute thereafter, the monocrystalline Si was left without etching, and the porous Si substrate was selectively etched and completely removed, using the monocrystalline Si as an etch-stop material.

The etching rate of monocrystalline in the etching solution was very low, for example, about 50 Å or less even after one minute, and selectivity to the etching rate of porous Si layer reached $10^5$ or more. The etching rate of the nonporous layer (the decrease in the film thickness was several tens Å) could be practically disregarded.

After removal of the Si$_3$N$_4$ layer from the back side, a monocrystalline Si layer having a thickness of 1 μm was patterned on the islands, and heat treated at 900° C. for 30 minutes to increase the bonding strength By the heat treatment these two substrates were strongly bonded to each other.

That is, after removal of the Si$_3$N$_4$ layer from the back side, a monocrystalline Si layer having a thickness of 1 μm could be left on the fused quartz substrate. Even by the selective etching of the porous Si, the monocrystalline Si layer was not changed at all. Cross-sectional observation by a transmission electron microscope revealed that no new crystal defects were introduced into the Si layer and a good crystallinity was maintained.

EXAMPLE 16

A first p-type or n-type (100) monocrystalline Si substrate having a diameter of 6 inches, a thickness of 625 μm and a resistivity of 0.01Ω·cm was anodized in an HF solution under the following anodization conditions.
Current density: 5 mA·cm$^{-2}$
Anodizing solution: HF:H$_2$O:C$_2$H$_5$OH=1:1:1
Time: 12 minutes
Thickness of porous Si: 10 μm
Porosity: 45%

The anodized substrate was oxidized in an oxygen atmosphere at 400° C. for one hour. The inside walls of pores in the porous Si was covered by a thermally oxidized film. Monocrystalline Si was made to epitaxially grow on the porous Si to a thickness of 0.3 μm by CVD method under the following growth conditions.
Source gas: SiH$_2$Cl$_2$/H$_2$
Gas flow rate: 0.5/180 liter/min.
Gas pressure: 80 Torr
Temperature: 950° C.
Growth rate: 0.3 μm/min.

Then, the surface of the Si layer was brought into contact with the surface of a fused quartz substrate by laying the former onto the latter and subjected to anodic bonding at 500° C. to bond former to the latter. These two substrates were strongly bonded to each other by the thereby.

Then, the first Si substrate was removed by grinding and polishing, while making the first Si substrate to still have a thickness of 5 μm, and only the other surface of the fused quartz substrate of the bonded substrates was coated with Si$_3$N4 and then the remaining monocrystalline Si substrate was selectively etched away in an aqueous KOH solution (30%) at 110° C., using the porous Si layer having oxidized inside walls of pores as an etch-stop layer. One minute thereafter, all the first Si substrate was etched and the porous Si layer was exposed in the entire region.

Then, the porous Si layer was selectively etched in a liquid mixture of buffered hydrofluoric acid (36% NH$_4$F+4.5% HF+H$_2$O), and an alcohol (10:1) without stirring. 1.4 minutes thereafter, the monocrystalline Si was left without etching, and the porous Si substrate was selectively etched and completely removed, using the monocrystalline Si as an etch-stop material.

The etching rate of nonporous Si monocrystal in the etching solution was very low, for example, about 50 Å or less even after 1.4 minutes, and selectivity to the etching rate of porous Si layer reached $10^5$ or more. The etching rate of the nonporous layer (the decrease in the film thickness was several tens Å) could be practically disregarded.

That is, after removal of the Si$_3$N$_4$ layer from the back side, a monocrystalline Si layer having a thickness of 0.3 μm could be left on the fused quartz substrate. Even by the selective etching of the porous Si, the monocrystalline Si layer was not changed at all.

Cross-sectional observation by a transmission electron microscope revealed that no new crystal defects were introduced into the Si layer and a good crystallinity was maintained.

EXAMPLE 17

A first n-type (100) monocrystalline Si substrate having a diameter of 6 inches, a thickness of 625 μm and a resistivity of 0.01Ω·cm was anodized in an HF solution under the following anodization conditions.
Current density: 5 mA·cm$^{-2}$
Anodizing solution: HF:H$_2$O:C$_2$H$_5$OH=1:1:1
Time: 12 minutes
Thickness of porous Si: 10 μm
Porosity: 45%

The porous Si was readily oxidized in the atmosphere. By RCA washing before epitaxial growth, oxidation of the pore insides was promoted. By the oxidation, the inside walls of pores in the porous Si were covered by an oxide film. Monocrystalline Si was made to epitaxially grow on the porous Si to a thickness of 0.3 μm by CVD method under the following growth conditions.
Source gas: SiH$_2$Cl$_2$/H$_2$
Gas flow rate: 0.5/180 liter/min.
Gas pressure: 80 Torr
Temperature: 950° C.
Growth rate: 0.3 μm/min.

Furthermore, an Si layer was formed on the surface of the epitaxial Si layer to a thickness of 500 nm by thermal oxidation.

Then, the surface of the SiO$_2$ layer was brought into contact with the surface of a fused quartz substrate by laying the former onto the latter and subjected to anodic bonding at 500° C. to bond the former to the latter.

Then, the first Si substrate was removed by grinding and polishing, while making the first Si substrate to still have a thickness of 5 μm, and then only the other surface of the fused quartz substrate of the bonded substrates was coated with Si$_3$N$_4$ and then the remaining monocrystalline Si substrate was selectively etched away in a solution of ethylenediamine+pyrocatechol+water (17 ml:3 g:8 ml) at 110° C., using the porous Si layer having oxidized inside walls of pores as an etch-stop layer, 3 minutes thereafter, all the first Si substrate was etched and the porous Si layer was exposed in the entire region.

Then, the porous Si layer was selectively etched in buffered hydrofluoric acid (36% NH$_4$F+4.5% HF+H$_2$O) with stirring. 1.3 minutes thereafter, the monocrystalline Si was left without etching, and the porous Si substrate was selectively etched and completely removed, using the monocrystalline Si as an etch-stop material The etching rate of nonporous Si monocrystal in the etching solution was very low, for example, about 50 Å or less after 1.3 minutes, and selectivity to the etching rate of porous Si layer reached $10^5$ or more. The etching rate of the nonporous layer (the decrease in the film thickness was several tens Å) could be practically disregarded.

That is, after removal of the Si$_3$N$_4$ layer from the back side, the bonded substrates were subjected to heat treatment at 900° C. for 30 minutes to increase the bonding strength. By the heat treatment, these two substrates were strongly bonded to each other. That is, a monocrystalline Si layer having a thickness of 0.3 μm could be left on the insulating substrate. Even by the selective etching of the porous Si, the monocrystalline Si layer was not changed at all. Cross-sectional observation by a transmission electron microscope revealed that no new crystal defects were introduced into the Si layer and a good crystallinity was maintained.

As described above, the present invention can provide a semiconductor device substrate and a process for preparing the same, which can solve the above-mentioned problems of the prior art and can satisfy the above-mentioned requirements.

In the present invention a monocrystalline Si layer of considerably less defects is formed on the insulating substrate by removing other layers than the Si active layer from one side of a monocrystalline Si substrate having a very distinguished crystallinity, a uniform flatness over the layer area and a distinguished economy, while leaving the Si active layer on the surface.

Furthermore, the present invention can provide a process for obtaining a monocrystalline Si layer of good crystallinity on a light-transmissive substrate and an insulating substrate with distinguished productivity, uniformness, controllability and economy, and a driving device of high performance can be formed on the monocrystalline Si on the light-transmissive substrate. Thus, a sensor or image elements of a displace device can be made to have a much higher density and a higher micronization.

Still furthermore, the present invention can realize the advantages of SOI devices of the prior art and thus can provide a process for preparing a widely applicable semiconductor device substrate.

Still furthermore, the present invention can propose a process for preparing a semiconductor device substrate that can serve as a substitute for expensive SOS or SIMOX in the preparation of layer scale integrated circuits of SOI structure.

In the present invention, a monocrystalline Si substrate having an originally good quality is used as a starting material, and the monocrystalline layer is left only on the surface, while chemically removing the lower Si substrate, and the monocrystalline layer is transferred onto the insulating substrate or the light-transmissive substrate. As described in detail in Examples, a large number of treatments can be carried out in a short time, resulting in a large progress in the productivity and economy.

According to the present invention, a two-stage selective etching, where the selectivity at the second stage is remarkably distinguished, is carried out, and thus an Si monocrystal having a uniform flatness over a large area and a very distinguished crystallinity can be obtained.

It is well known that oxidation of inside walls of pores in the porous Si is effective for controlling structural changes of porous Si by a heating step, but in the present invention the following further effects can be obtained:

(1) The selectivity at the first stage can be increased.
(2) The etching rate of porous Si at the second stage can be accelerated, resulting in a higher selectivity.

In the selective etching of bulk Si at the first stage, inside surface of pores in the porous Si are covered with an oxide film, and an etching solution having a higher etching rate on Si than on SiO$_2$ is used, where the porous Si layer serves as a satisfactory etch-stop layer.

The regions where the porous Si layer is exposed at first due to unevenness of porous Si thickness or etching unevenness at the first stage, etc. wait for the completion of etching of bulk Si in other regions, and thus the porous Si will be thinner. However, the unevenness of the remaining thickness of porous Si can be throughly compensated by the remarkably distinguished selectivity of etching at the second stage.

According to the present invention, a wet chemical etching solution having no adverse effect on the semiconductor process can be used in the etching of porous Si, and an etching selectivity to porous Si, as compared with nonporous Si, is $10^5$ or more, resulting in larger progress in the controllability and productivity.

It is particularly important in the present invention that the selectively etching method of porous Si: comprises in hydrofluoric acid, or a liquid mixture of hydrofluoric acid and at least one of an alcohol and a hydrogen peroxide solution, or buffered hydrofluoric acid and a liquid mixture of buffered hydrofluoric acid and at least one of an alcohol and a hydrogen peroxide solution as a selective etching liquid having no etching action on the crystalline Si.

In the present invention, hydrogen peroxide in the selective wet, chemical etching solution on the porous Si acts as an oxidizing agent and can control the reaction rate by changing the mixing ratio of hydrogen peroxide.

In the present invention, an alcohol in the selective wet chemical etching solution on the porous Si acts as a surfactant and can remove bubbles of reaction product gases by etching instantaneously from the etched surface, whereby selective etching of porous Si can be carried out uniformly and efficiently.

What is claimed is:

1. A process for preparing a semiconductor device substrate which comprises a step of making at least one surface of a first substrate composed of Si material porous, a step of oxidizing inside walls of pores in the resulting porous Si surface layer, a step of forming a monocrystalline Si layer on the porous Si surface layer, a step of bonding the monocrystalline Si layer to one surface of a second substrate through an insulating layer therebetween, a first etching step of removing the first substrate by selective etching except for the porous Si layer, and a second etching step of impregnating the porous Si layer exposed by the removal of the first substrate with hydrofluoric acid or a first liquid mixture of hydrofluoric acid and at least one of an alcohol and a hydrogen peroxide solution, or by buffered hydrofluoric acid or a second liquid mixture of buffered hydrofluoric acid and at least one of an alcohol and an hydrogen peroxide solution, thereby selectively removing the porous Si layer.

2. A process according to claim 1, wherein the second substrate is composed of Si material.

3. A process according to claim 1, wherein the second substrate is composed of a light-transmissive material.

4. A process for preparing a semiconductor device substrate which comprises a step of making at least one surface of a first substrate composed of Si material porous, a step of oxidizing inside walls of pores in the resulting porous Si surface layer, a step of forming monocrystalline Si layer on the porous Si surface layer, a step of bonding the monocrystalline Si layer to one surface layer of a second substrate composed of Si material through an insulating layer, a step of removing the first substrate to a depth just before the porous Si layer is exposed, or to a depth where the porous Si layer is partially exposed, a first etching step of selectively etching the first substrate by etching except for the porous Si layer, and a second etching step of impregnating the porous Si layer exposed by the removal of the first substrate with hydrofluoric acid or a first liquid mixture of hydrofluoric acid and at least one of an alcohol and a hydrogen peroxide solution, or by buffered hydrofluoric acid, or a second liquid mixture of buffered hydrofluoric acid and at least one of an alcohol and a hydrogen peroxide solution, thereby selectively removing the porous Si layer.

5. A process according to claim 1 or 4 wherein the insulating layer is formed on at least one of the surfaces of the monocrystalline Si layer and the second substrate.

6. A process according to claim 1 or 4, wherein the insulating layer is provided between the monocrystalline layer and the second substrate.

7. A process according to claim 5, wherein the insulating layer is a thermally oxidized film, a deposited $SiO_2$ film, or a deposited Si film, or a multi-layered film thereof.

8. A process according to claim 6, wherein the insulating layer is an insulating thin plate provided between the first substrate and the second substrate to bond to the respective substrates.

9. A process according to claim 1 or 4, wherein the bonding step in carried out by one of anodic bonding, compression, heat treatment and a combination thereof.

10. A process according to claim 1 or 4, wherein the step of making the first substrate porous is carried out by anodization.

11. A process according to claim 10, wherein the anodization is carried out in a HF solution.

12. A process according to claim 1 or 4, wherein the step of oxidizing the porous Si layer is carried out by thermal oxidation, spontaneous oxidation in the atmosphere, oxidation in a washing step with RCA or the like, or a combination thereof.

13. A process for preparing a semiconductor device substrate which comprises a step of making at least one surface of a first substrate composed of Si material porous, a step of oxidizing inside walls of pores in the resulting Si porous surface layer, a step of forming a monocrystalline Si layer on the porous Si surface layer, a step of bonding the surface of the monocrystalline Si layer to one surface of a second substrate composed of a light-transmissive material through an insulating layer, a first etching step of forming an etching resistant mask on the bonded second layer and then removing the first Si substrate by selective etching except for the porous Si layer, a second etching step of impregnating the porous Si layer exposed by the removal of the first Si substrate with hydrofluoric acid or a first liquid mixture of hydrofluoric acid and at least one of an alcohol and a hydrogen peroxide solution or buffered hydrofluoric acid or a second liquid mixture of buffered hydrofluoric acid and at least one of an alcohol and a hydrogen peroxide solution, thereby selectively removing the porous Si layer, and a step of removing the etching-resistant mask and increasing a bonding strength obtained in the bonding step when it fails to reach a desired one.

14. A process for preparing a semiconductor device substrate which comprises a step of making at least one surface of a first substrate composed of Si material porous, a step of oxidizing inside walls of pores in the resulting porous Si surface layer, a step of forming a monocrystalline Si layer on the porous Si surface layer, a step of bonding the surface of the monocrystalline Si layer to one surface of a second substrate composed of a light-transmissive material through an insulating layer, a step of removing the first substrate to a depth just before the porous Si layer is exposed, or to a depth where the porous Si layer is partially exposed, a first etching step of removing the first substrate by selective etching except for the porous Si layer, a second etching step of impregnating the porous Si layer exposed by the removal of the first substrate with hydrofluoric acid or a first liquid mixture of hydrofluoric acid and at least one of an alcohol and a hydrogen peroxide solution or buffered hydrofluoric acid or a second liquid mixture of buffered hydrofluoric acid and at least one of an alcohol and a hydrogen peroxide solution, thereby selectively removing the porous Si layer, and a step of increasing a bonding strength obtained in the bonding step when it fails to reach a desired one.

15. A process according to claim 13 or 14, wherein the insulating layer is formed on at least one of surfaces of the monocrystalline Si layer and the second substrate.

16. A process according to claim 15, wherein the insulating layer in one of a thermally oxidized film, a deposited $SiO_2$ film, a deposited $Si_3N_4$ film and a multi-layered film thereof.

17. A process for preparing a semiconductor device substrate which comprises a step of making at least one surface of a first substrate composed of Si material porous, a step of oxidizing inside walls of pores in the resulting porous Si surface layer, a step of forming a monocrystalline Si layer on the porous Si surface layer, a step of bonding the surface of the monocrystalline Si layer to one surface of a second substrate composed of a light-transmissive material, a first etching step of removing the first substrate by selective etching, a second etching step of impregnating the porous Si layer exposed by the removal of the first substrate with hydrofluoric acid or a first liquid mixture of hydrofluoric acid and at least one of an alcohol and a hydrogen peroxide solution or buffered hydrofluoric acid or a second liquid mixture of buffered hydrofluoric acid and at least one of an alcohol and a hydrogen peroxide solution, thereby selectively removing the porous Si layer, and a step of increasing a bonding strength obtained in the bonding step when it fails to reach a desired one.

18. A process for preparing a semiconductor device substrate which comprises a step of making at least one surface of a first substrate composed of Si material porous, a step of oxidizing inside walls of pores in the resulting porous Si surface layer, a step of forming a monocrystalline Si layer on the porous Si surface layer, a step of bonding the surface of the monocrystalline Si layer to one surface of a second substrate composed of a light-transmissive material, a step of removing the first substrate to a depth just before the porous Si layer is exposed or to a depth where the porous Si layer is partially exposed, a first etching step of removing the first substrate selective etching except for the porous Si layer, a second etching step of impregnating the porous Si layer exposed by the removal of the first substrate with hydrofluoric acid or a first liquid mixture of hydrofluoric acid and at least one of an alcohol and a hydrogen peroxide solution or buffered hydrofluoric acid or a second liquid mixture of buffered hydrofluoric acid and at least one of an alcohol and a hydrogen peroxide solution, thereby selectively removing the porous Si layer, and a step of increasing a bonding strength obtained in the bonding step when it fails to reach a desired one.

19. A process according to any one of claims 13, 14, 15 and 16, wherein the bonding step is carried out by anodic oxidation, compression, heat treatment or a combination thereof.

20. A process according to any one of claims 13, 14, 15 and 16, wherein the step of making the first substrate porous is carried out by anodization.

21. A process according to claim 20, wherein the anodization is carried out in a HF solution.

22. A process according to any one of claims 13, 14, 15 and 16, wherein the step of oxidizing the porous Si layer is carried out by thermal oxidation, spontaneous oxidation in the atmosphere, oxidation in a washing step with RCA or the like or a combination thereof.

23. A semiconductor device substrate prepared according to the process of any one of claims 1 to 22.

* * * * *

UNITED STATES PATENT AND TRADEMARK OFFICE
CERTIFICATE OF CORRECTION

PATENT NO. : 5,277,748

DATED : January 11, 1994

INVENTOR(S) : KIYOFUMI SAKAGUCHI ET AL.           Page 1 of 5

It is certified that error appears in the above-identified patent and that said Letters Patent is hereby corrected as shown below:

Title page, item [57],
 [57] ABSTRACT

Line 16, "bufffered" should read --buffered--.
        Line 17, "an" should read --a--.

COLUMN 2

Line 11, "be" should read --been--.
        Line 18, "in" should read --is--.
        Line 20, "trail," should read --trial,--.
        Line 41, "in" should read --is--.

COLUMN 3

Line 52, "semiconductor" should read --semiconductors--.

COLUMN 4

Line 24, "crystalline" should read --crystallinity--.
        Line 42, "as" should read --such as in--.

COLUMN 5

Line 2, "crystallity" should read --crystallinity--.
        Line 37, "peroxides" should read --peroxide--.

UNITED STATES PATENT AND TRADEMARK OFFICE
CERTIFICATE OF CORRECTION

PATENT NO. : 5,277,748

DATED : January 11, 1994

INVENTOR(S) : KIYOFUMI SAKAGUCHI ET AL.

It is certified that error appears in the above-identified patent and that said Letters Patent is hereby corrected as shown below:

COLUMN 7

Line 19, "fluoricnitric" should read --fluoric-nitric--.
Line 50, "stance" should read --stances--.
Line 64, "et al" should read --et al.--.
Line 67, "et al" should read --et al.--.

COLUMN 8

Line 22, "et al" should read --et al.--.
Line 54, "view" should read --views--.

COLUMN 9

Line 64, "surface" should read --surfaces--.

COLUMN 11

Line 26, "defected" should read --detected--.
Line 35, "with" (2nd occurrence) should be deleted.

COLUMN 12

Line 13, "defected" should read --detected--.
Line 55, "defected" should read --detected--.

COLUMN 13

Line 52, "1.1:1" should read --1:1:1--.

UNITED STATES PATENT AND TRADEMARK OFFICE
CERTIFICATE OF CORRECTION

PATENT NO. : 5,277,748
DATED : January 11, 1994
INVENTOR(S) : KIYOFUMI SAKAGUCHI ET AL.

It is certified that error appears in the above-identified patent and that said Letters Patent is hereby corrected as shown below:

COLUMN 15

Line 4, "surface" should read --surfaces--.

COLUMN 19

Line 65, "2 hour." should read --2 hours.--.

COLUMN 20

Line 47, "vew" should read --new--.

COLUMN 22

Line 1, "rowth" should read --growth--.

COLUMN 26

Line 14, "lest" should read --left--.
Line 31, "crystalline" should read --crystallinity--.
Line 65, "There" should read --These--.

COLUMN 29

Line 36, "inches a" should read --inches, a-- and "625 ∥m" should read --625 µm--.

UNITED STATES PATENT AND TRADEMARK OFFICE
CERTIFICATE OF CORRECTION

PATENT NO. : 5,277,748

DATED : January 11, 1994

INVENTOR(S) : KIYOFUMI SAKAGUCHI ET AL.   Page 4 of 5

It is certified that error appears in the above-identified patent and that said Letters Patent is hereby corrected as shown below:

COLUMN 30

Line 68, "white" should read --while--.

COLUMN 32

Line 35, "maintained" should read --maintained.--.

COLUMN 33

Line 47, "was" should read --were--.
Line 61, "by the" should be deleted.

COLUMN 36

Line 37, "Si:" should read --Si--.
Line 38, "in" should be deleted.

UNITED STATES PATENT AND TRADEMARK OFFICE
CERTIFICATE OF CORRECTION

PATENT NO. : 5,277,748

DATED : January 11, 1994

INVENTOR(S) : KIYOFUMI SAKAGUCHI ET AL.    Page 5 of 5

It is certified that error appears in the above-identified patent and that said Letters Patent is hereby corrected as shown below:

<u>COLUMN 37</u>

Line 5, "an" should read --a--.
Line 44, "Si film," should read --$Si_3N_4$ film,--.
Line 51, "in" should read --is--.
Line 52, "and" should read --or--.

Signed and Sealed this

Ninth Day of August, 1994

Attest:

BRUCE LEHMAN

*Attesting Officer*    *Commissioner of Patents and Trademarks*